United States Patent [19]
Noma et al.

[11] Patent Number: 5,379,306
[45] Date of Patent: Jan. 3, 1995

[54] VITERBI DECODING METHOD

[75] Inventors: Nobuhiko Noma, Yokohama; Mikio Mizutani; Tsukasa Sakai, both of Tokyo; Kazuo Kurita, Tokushima; Osamu Noguchi, Tokyo; Hiroyuki Nemoto, Tokyo; Keiichi Tomita, Tokyo, all of Japan

[73] Assignee: Matsushita Graphic Communication Systems, Inc., Tokyo, Japan

[21] Appl. No.: 935,936

[22] Filed: Aug. 27, 1992

[30] Foreign Application Priority Data

Aug. 28, 1991 [JP] Japan ................... 3-217495

[51] Int. Cl.$^5$ ............................................. G06F 11/00
[52] U.S. Cl. ........................................ 371/43; 371/44
[58] Field of Search ............... 371/43, 44, 45, 37.8; 375/17, 42, 56, 57, 83

[56] References Cited

U.S. PATENT DOCUMENTS

| | | | |
|---|---|---|---|
| 5,162,812 | 11/1992 | Aman et al. ............ | 371/43 |
| 5,231,639 | 7/1993 | Matui ..................... | 371/43 |
| 5,233,629 | 8/1993 | Paik et al. ............... | 371/37.8 |
| 5,263,052 | 11/1993 | Borth et al. ............. | 371/43 |

OTHER PUBLICATIONS

*Structured Computer Organization* Third Edition by Andrew S. Tanenbaum ©1990 by Prentice-Hall, Inc. pp. 11-13.

*Primary Examiner*—Vincent P. Canney
*Attorney, Agent, or Firm*—Lowe, Price, LeBlanc & Becker

[57] ABSTRACT

A Viterbi decoding method, in which consecutive input data bits $Q_{6n} \sim Q_{1n}$ are first converted into consecutive code bits $Q_{6n} \sim Q_{3n} Y_{2n} Y_{1n} Y_{0n}$ at a time instant n by use of a Trellis encoder. Then, a branch metric, which is a minimum Euclidean distance between a reception signal point and each of signal points (namely, Trellis codes $Q_6 \sim Q_3 Y_2 Y_1 Y_0$) in a signal space diagram, corresponding to each of eight states 0 to 7 and a corresponding signal point are obtained. Further, a sum of the branch metric corresponding to each state and a corresponding path metric at a time instant (n−1), which is a sum of corresponding branch metrics since a time instant 1 to the time instant (n−1) is calculated. Then, the path metric corresponding to each state is updated by replacing it with the calculated sum of the corresponding branch metric and the corresponding path metric obtained at the time instant (n−1). Subsequently, a minimum one of the path metrics is determined as the latest part of a surviving path. Moreover, the surviving path is traced back to a signal point $Q_{61} \sim Q_{31} Y_{21} Y_{11} Y_{01}$ at the time instant 1. Thus input data bits $Q_{61} \sim Q_{31} Q_{21} Q_{11}$ at the time instant 1 is restored. In case of this method, the signal points are classified according to three bits $Y_{21} Y_{11} Y_{01}$ into eight groups. Further, one of the groups is determined as a reference group. Furthermore, tables representing the signal points of the other groups are calculated from a table representing the signal points of the reference group.

6 Claims, 30 Drawing Sheets

FIG. 2

| INPUT | | PRECEDING OUTPUT | | OUTPUT | |
|---|---|---|---|---|---|
| $Q1n$ | $Q2n$ | $Y1n-1$ | $Y2n-1$ | $Y1n$ | $Y2n$ |
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 1 | 1 |
| 0 | 1 | 0 | 0 | 0 | 1 |
| 0 | 1 | 0 | 1 | 0 | 0 |
| 0 | 1 | 1 | 0 | 1 | 1 |
| 0 | 1 | 1 | 1 | 1 | 0 |
| 1 | 0 | 0 | 0 | 1 | 0 |
| 1 | 0 | 0 | 1 | 1 | 1 |
| 1 | 0 | 1 | 0 | 0 | 1 |
| 1 | 0 | 1 | 1 | 0 | 0 |
| 1 | 1 | 0 | 0 | 1 | 1 |
| 1 | 1 | 0 | 1 | 1 | 0 |
| 1 | 1 | 1 | 0 | 0 | 0 |
| 1 | 1 | 1 | 1 | 0 | 1 |

BINARY NUMBER : $Q_{6n}\ Q_{5n}\ Q_{4n}\ Q_{3n}\ Y_{2n}\ Y_{1n}\ Y_{0n}$

GROUP 2 XXXX010

GROUP 3 XXXX011

GROUP 6   XXXX110

GROUP 7   XXXX111

FIG. 23

```
TIT      "V17 VITERBI"

V17DEC1  RDECIN, COEF0, DECTBL, MAPTBL, CTOP ; STATE0
V17DEC1  RDECIN, COEF1, DECTBL, MAPTBL, CTOP ; STATE1
V17DEC1  RDECIN, COEF2, DECTBL, MAPTBL, CTOP ; STATE2
V17DEC1  RDECIN, COEF3, DECTBL, MAPTBL, CTOP ; STATE3
V17DEC1  RDECIN, COEF4, DECTBL, MAPTBL, CTOP ; STATE4
V17DEC1  RDECIN, COEF5, DECTBL, MAPTBL, CTOP ; STATE5
V17DEC1  RDECIN, COEF6, DECTBL, MAPTBL, CTOP ; STATE6
V17DEC1  RDECIN, COEF7, DECTBL, MAPTBL, CTOP ; STATE7

MULVA    7, GAIN, DTOP

VSTMIN   0, DTOP+0, LTOP0, LTOP1, LTOP5, LTOP4, LTOPP, WORK0
VSTMIN   1, DTOP+1, LTOP2, LTOP6, LTOP7, LTOP3, LTOPP, WORK1
VSTMIN   2, DTOP+0, LTOP4, LTOP5, LTOP1, LTOP0, LTOPP, WORK2
VSTMIN   3, DTOP+1, LTOP7, LTOP3, LTOP2, LTOP6, LTOPP, WORK3
VSTMIN   4, DTOP+0, LTOP1, LTOP0, LTOP4, LTOP5, LTOPP, WORK4
VSTMIN   5, DTOP+1, LTOP3, LTOP7, LTOP6, LTOP2, LTOPP, WORK5
VSTMIN   6, DTOP+0, LTOP5, LTOP4, LTOP0, LTOP1, LTOPP, WORK6
VSTMIN   7, DTOP+1, LTOP6, LTOP2, LTOP3, LTOP7, LTOPP, WORK7

VTLDEC   WORK0, LTOP, TABSTART, TABLAST, 7, VITOUT

MRTS

VITOUT OUTPUT DATA
```

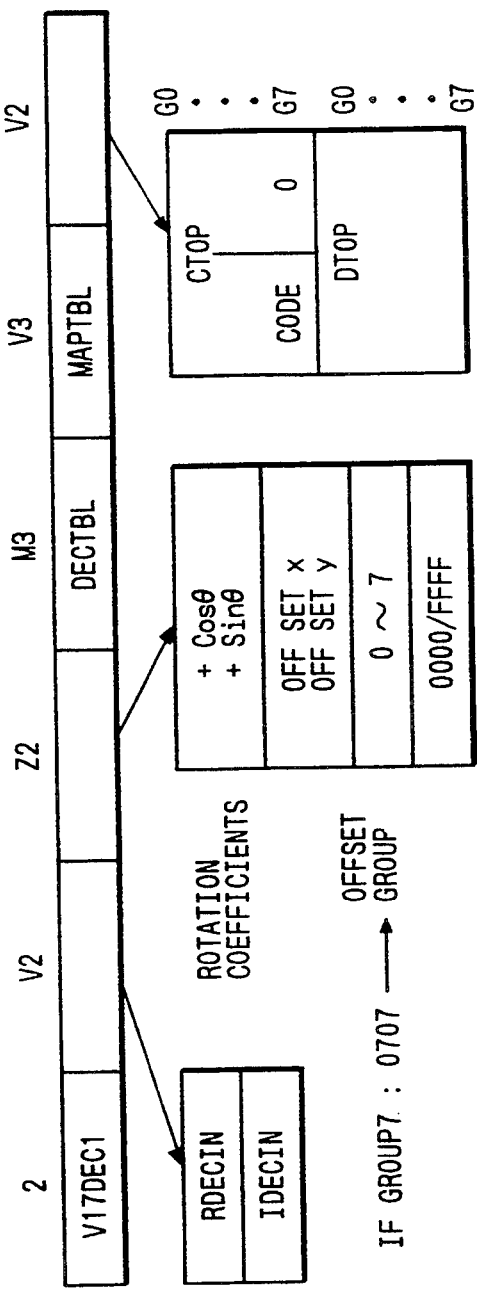
FIG. 24
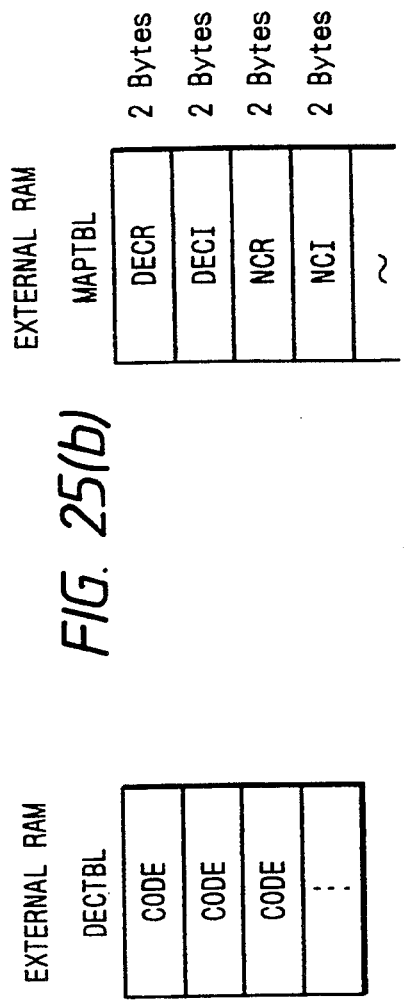
FIG. 25(a)
FIG. 25(b)

FIG. 26(a)

DECTBL 14.4K : UPPER PART, 12.0K : LOWER PART
TC96 : UPPER PART, TC72 : LOWER PART

CODE : Q6 Q5 Q4 Q3/Q6 Q5 Q4 Q3

FIG. 26(b)

RDECIN : X7 X6 X5 X4 X3 X2 X1 X0 0 0 0 0 0 0 0 0

IDECIN : Y7 Y6 Y5 Y4 Y3 Y2 Y1 Y0 0 0 0 0 0 0 0 0

FIG. 26(c)

CTOP   CODE : 0 Q6 Q5 Q4 Q3 <u>Y2 Y1 Y0</u>

GROUP

FIG. 27(a)

$$\begin{bmatrix} X \\ Y \end{bmatrix} = \begin{bmatrix} \cos\theta & -\sin\theta \\ \sin\theta & \cos\theta \end{bmatrix} \begin{bmatrix} RDECIN \\ IDECIN \end{bmatrix} + \begin{bmatrix} OFSETx \\ OFSETy \end{bmatrix}$$

FIG. 27(b)

FROM X & Y COORDINATES =
   (X7 X6 X5 X4 X3 X2 X1 X0, Y7 Y6 Y5 Y4 Y3 Y2 Y1 Y0)

GENERATE
   (X7 X6 X5 X4 X3 Y7 Y6 Y5 Y4 Y3)

FIG. 28(a)

ACCESS ADDRESS
  {(L.A. OF DECTBL) + (X7 X6 X5 X4 X3 Y7 Y6 Y5 Y4 Y3)} OF EXTERNAL RAM

L.A. : LEADING ADDRESS

READ UPPER OR LOWER PART OF CODE

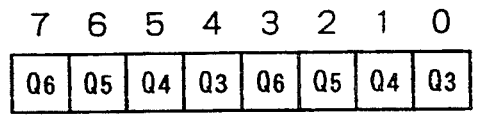

| 7 | 6 | 5 | 4 | 3 | 2 | 1 | 0 |
|---|---|---|---|---|---|---|---|
| Q6 | Q5 | Q4 | Q3 | Q6 | Q5 | Q4 | Q3 |

NO Q6 MODE : Q6 = 0
NO Q5 MODE : Q5 = 0
NO Q4 MODE : Q4 = 0

STORE DATA HAVING FORMAT
  0 Q6 Q5 Q4 Q3/Y2 Y1 Y0
    IN ROW OF CORRESPONDING GROUP NO. OF CTOP

FIG. 28(b)

ACCESS ADDRESS
  {MAPTBL + (Q6 Q5 Q4 Q3 Y2 Y1 Y0) * 8} OF EXTERNAL RAM

READ   DECR, DECI

STORE  $(RDECIN - DECR)^2 + (IDECIN - DECI)^2$
         IN ROW OF CORRESPONDING GROUP NO. OF DTOP

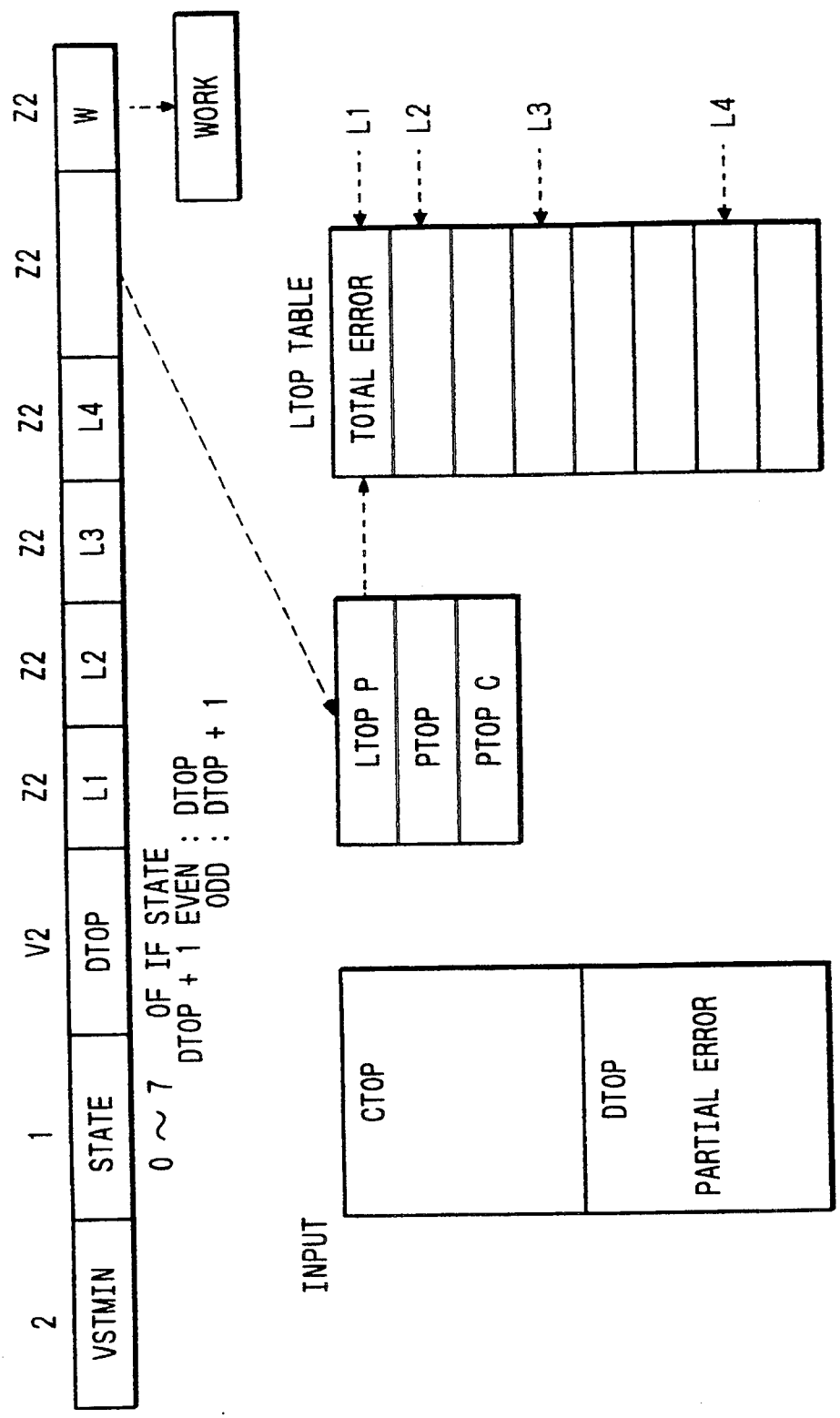

FIG. 30

Viterbi Table (Z-reg)

PTOP   PTOP C

| STATE0 | STATE1 | STATE2 | STATE3 | STATE4 | STATE5 | STATE6 | STATE7 |
|--------|--------|--------|--------|--------|--------|--------|--------|
|        |        |        |        |        |        |        |        |
|        |        |        |        |        |        |        |        |
|        |        |        |        |        |        |        |        |
|        |        |        |        |        |        |        |        |

Viterbi Table : CYCLIC TABLE

FIG. 31

EXAMPLE 1) STATE 0

$$\left.\begin{array}{l}\text{LTOP(0) + DTOP(0) * GAIN}\\ \text{LTOP(1) + DTOP(2) * GAIN}\\ \text{LTOP(5) + DTOP(4) * GAIN}\\ \text{LTOP(4) + DTOP(6) * GAIN}\end{array}\right\}\text{WHICH IS MINIMUM ?}$$

↑ STATE    ↑ GROUP

IF LTOP(n) + DTOP(m) * GAIN = min, min → WORK
{CTOP(m) + (PTOP + n)} ⟶ (PTOP + 0)

IF {LTOP(5) + DTOP(4)} min,
   LTOP(5) + DTOP(4) * GAIN → WORK

FIG. 33(a)

| STATE 0 | |
|---|---|
| LTOP | DTOP |
| 0 | 0 |
| 1 | 2 |
| 5 | 4 |
| 4 | 6 |

FIG. 33(b)

| STATE 1 | |
|---|---|
| LTOP | DTOP |
| 2 | 1 |
| 6 | 3 |
| 7 | 5 |
| 3 | 7 |

FIG. 33(c)

| STATE 2 | |
|---|---|
| LTOP | DTOP |
| 4 | 0 |
| 5 | 2 |
| 1 | 4 |
| 0 | 6 |

FIG. 33(d)

| STATE 3 | |
|---|---|
| LTOP | DTOP |
| 7 | 1 |
| 3 | 3 |
| 2 | 5 |
| 6 | 7 |

FIG. 34(a)

| STATE 4 | |
|---|---|
| LTOP | DTOP |
| 1 | 0 |
| 0 | 2 |
| 4 | 4 |
| 5 | 6 |

FIG. 34(b)

| STATE 5 | |
|---|---|
| LTOP | DTOP |
| 3 | 1 |
| 7 | 3 |
| 6 | 5 |
| 2 | 7 |

FIG. 34(c)

| STATE 6 | |
|---|---|
| LTOP | DTOP |
| 5 | 0 |
| 4 | 2 |
| 0 | 4 |
| 1 | 6 |

FIG. 34(d)

| STATE 7 | |
|---|---|
| LTOP | DTOP |
| 6 | 1 |
| 2 | 3 |
| 3 | 5 |
| 7 | 7 |

FIG. 36(a)

Vitout : 0 Q6 Q5 Q4 Q3 Y2 Y1 Y0

Vitdfm : 0 0 Q6 Q5 Q4 Q3 Q2 Q1

FIG. 36(b)

GENERATE Vitdfm FROM Vitout
INVERSE DIFFERENTIAL ENCODER HAS STRUCTURE
AS SHOWN IN FIG. 2

FIG. 36(c)

① NORMALIZE WORKϕ~WORK7 TO ϕ
COPY WORKϕ ~ WORK7 ONTO LTOP

② PERFORM N-BAUD-RATE BACK TRACING FROM
MINIMUM VALUE OF WORK & OUTPUT Vitout

③ UPDATE PTOP & PTOPC

VITERBI DECODING METHOD

BACKGROUND OF THE INVENTION

1. Field of The Invention

This invention relates to a Viterbi decoding method of what is called a Trellis coding/Viterbi decoding method which is an error-correcting code method employed and specified in the CCITT (Comite Consultatif International de Telephone et Telegraph) recommendation V. 33 as a primary technique.

2. Description of The Related Art

Many studies of error correcting codes have been made since twenty or thirty years ago. Such studies take their origin from the fact that in 1948, C. E. Shannon presented a paper disclosing the presence of an error correcting code, which can decrease an error rate after decoded, in a noisy channel. Among many error-correcting coding methods such as a block code method, a Trellis coding/Viterbi decoding method is known as a method which is most suitable for correcting random errors and can obtain a very efficient coding gain. This is a method for minimizing a current error by using information on the past in order to reduce noises due to closeness of a receiving point.

Next, the Trellis coding/Viterbi decoding method will be described hereinbelow by referring to the accompanying drawings.

FIG. 1 illustrates the configuration of what is called a Trellis encoder according to the present invention. First, data to be transmitted from a terminal is converted by a parallel conversion device into 6-bit parallel data words (namely, 6-bit units of information). Then, all six bits $Q_{n6}$, $Q_{n5}$, $Q_{n4}$, $Q_{n3}$, $Q_{n2}$ and $Q_{n1}$ of each of the parallel data words are simultaneously transmitted therefrom over separate wires and input to the Trellis encoder. In this Trellis encoder, two bits $Q_{n2}$ and $Q_{n1}$ input to a differential encoding portion (hereunder sometimes referred to simply as a differential encoder) undergo a differential coding and resultant data is subsequently input to a convolutional encoding portion (hereunder sometimes referred to simply as a convolutional encoder) as 2-bit data to be encoded (hereunder sometimes referred to as coding data), the bits of which are represented by $Y_{n2}$ and $Y_{n1}$, respectively. FIG. 2 is a diagram for illustrating a coding effected by the differential encoder. When the coding is effected, a redundant bit is added to the two bits $Y_{n2}$ and $Y_{n1}$ and 3-bit resultant coding data, the bits of which are represented by $Y_{n2}$, $Y_{n1}$ and $Y_{n0}$, respectively, is obtained. The bits $Q_{n6}$ to $Q_{n3}$ are output from the Trellis encoder without any change. Consequently, the Trellis encoder outputs 7-bit data word comprised of the bits $Q_{n6}$ to $Q_{n3}$, $Y_{n2}$, $Y_{n1}$ and $Y_{n0}$.

In the convolutional encoder of FIG. 1, three consecutive data bits $W_{n3}$, $W_{n2}$ and $W_{n1}$ represent 8 states. Furthermore, transitions from a state represented by $W_{n3}$, $W_{n2}$ and $W_{n1}$ to four states represented by $W_{n+1\,3}$, $W_{n+1\,2}$ and $W_{n+1\,1}$ can occur. FIGS. 3 to 10 are state transition diagrams. FIG. 3 shows transitions from a state represented by the three bits 000 to four states respectively represented by 000, 010, 100 and 110. A set {000} described over a transition line drawn between the states represented by 000 indicates one of cases denoted by three consecutive data bits $\{Y_{n+1\,2}, Y_{n+1\,1}$ and $Y_{n+1\,0}\}$. Each of eight cases represented by the three consecutive data bits $\{Y_{n2}, Y_{n1}$ and $Y_{n0}\}$ is called a group. Namely, the eight cases represented by the three bits are called a 000-group (or a group 0) to a 111-group (or a group 7), respectively.

FIG. 11 is a signal space diagram showing 128 mapped signal points represented by 7-bit output data $Q_{n6} \sim Q_{n3}Y_{n2}Y_{n1}Y_{n0}$ of the Trellis encoder in case effecting Trellis Coded Modulation (TCM) at 14,400 bits per second (bps). The horizontal axis represents a real (Re) axis; and the vertical axis an imaginary (Im) axis. In this figure, binary numbers are binary values indicated by the data $Q_{n6} \sim Q_{n3}Y_{n2}Y_{n1}Y_{n0}$.

FIG. 12 is a schematic block diagram for illustrating the configuration of hardware of from the Trellis encoder 1 to a device for outputting an encoded signal to a circuit or line. The data $Q_{n6} \sim Q_{n3}Y_{n2}Y_{n1}Y_{n0}$ output from the Trellis encoder 1 of FIG. 1 is developed by a mapping portion 2 to data representing a communication point (namely, a signal point) of FIG. 11. Subsequently, the resultant data is decomposed therein into a real part thereof (hereunder sometimes referred to as Re-axis data) and an imaginary part thereof (hereunder sometimes referred to as Im-axis data), each of which is then filtered by a corresponding low-pass filter 3. Thereafter, the filtered Re-axis data is multiplied by COS $\omega$ t in a corresponding multiplier 4. Similarly, the filtered Im-axis data is multiplied by SIN $\omega$ t in a corresponding multiplier 4. Results of these multiplications are added to each other in an adder 5. Finally, a signal representing a result of this addition is output from the adder 5 and is transmitted to the circuit or line as the encoded signal. This is what is called Quadrature Amplitude Modulation (QAM) system.

FIG. 13 is a schematic block diagram illustrating the configuration of hardware for receiving an input encoded signal from the circuit or line, then decoding data represented by the input signal by using of a Viterbi decoder 11 and outputting resultant data. First, transmitted data represented by the received encoded signal from the circuit or line is input to a multiplier 6, whereupon the transmitted data is multiplied by COS $\omega$ t to obtain Re-axis data. Further, the transmitted data is also input to another multiplier 6, whereupon the transmitted data is multiplied by SIN $\omega$ t to obtain Im-axis data. Then, each of the obtained Re-axis and Im-axis data is filtered by a corresponding low-pass filter 7. Subsequently, the filtered Re-axis and Im-axis data are input to an equalizer portion 8 whereupon a distortion is eliminated from each of the Re-axis and Im-axis data. Thereafter, the Re-axis and Im-axis data output from the portion 8 are input to a carrier automatic-phase-control (APC) device 9 to regulate the phase thereof. The data output from the device 9 and developed to a signal space 10 represented by using the Im-axis and Re-axis is shown in the lower right region of FIG. 13. Such received data is then decoded by the Viterbi decoder 11 to restore the original signal representing the data $Q_{n6} \sim Q_{n3}Q_{n2}Q_{n1}$.

When decoding the received data in case of a 14,400-bps operation, the 128 signal points of FIG. 11 are searched for the transmitted signal point because the transmitted signal point should be one of the 128 signal points. It is, however, usual that data representing a point or position shifted from the signal point of FIG. 11 is transmitted due to a noise or distortion occurring during the transmission. Therefore, it should be estimated from a signal point indicated by the actually transmitted data (hereunder sometimes referred to as a reception signal point) what would be correct output data in case where no noise or distortion occurred during the transmission. Thus, a conventional method, which will be outlined hereinbelow, is performed in order to make such an estimation. First, the signal points of FIG. 11 represented by the data $Q_{n6} \sim Q_{n3}Y_{n-2}Y_{n1}Y_{n0}$ are classified into 8 groups according to or correspondingly to three consecutive bits $Y_{n2}Y_{n1}Y_{n0}$, the binary value of each of which ranges from 000 to 111. Each signal point is positioned apart from other signal points. Thus, in each group of signal points, a signal point closest to the reception signal point is detected. Subsequently, it is determined which one of the detected signal points respectively corresponding to the eight groups is closest to the reception signal point. Then, the correct output data is estimated by further taking into account information on previous transmissions to minimize an estimation error.

FIG. 14 shows the distribution of the signal points of the eight groups of FIG. 11, in which character A represents a signal point corresponding to a case that $Y_{n-2}Y_{n1}Y_{n0}=000$; H a signal point corresponding to a case that $Y_{n2}Y_{n1}Y_{n0}=001$; B a signal point corresponding to a case that $Y_{n2}Y_{n1}Y_{n0}=010$; E a signal point corresponding to a case that $Y_{n2}Y_{n1}Y_{n0}=011$; C a signal point corresponding to a case that $Y_{n2}Y_{n1}Y_{n0}=100$; F a signal point corresponding to a case that $Y_{n2}Y_{n-1}Y_{n0}=101$; D a signal point corresponding to a case that $Y_{n2}Y_{n1}Y_{n0}=110$; G a signal point corresponding to a case that $Y_{n2}Y_{n1}Y_{n0}=111$; and subscripts 0 to 15 decimal values indicated by four consecutive bits $Q_{n6}Q_{n5}Q_{n4}Q_{n3}$ (namely, each group consists of 16 signal points respectively corresponding to the subscripts 0 to 15).

FIGS. 15 to 22 correspond to the eight groups of the signal points, respectively (namely, these figures illustrate the distributions of the signal points of the eight groups, respectively). For instance, FIG. 15 illustrates 16 signal points, which are represented by characters $0\sim9$, A, B, C, D, E and F of the group corresponding to a case that $Y_{n2}Y_{n1}Y_{n0}=000$.

As described above, the conventional method requires diagrams like FIGS. 15 to 22 respectively corresponding to the eight groups (or tables based on such diagrams). Further, in the prior art, a decoder is constituted only by hardware, and a decoding by software using macroinstructions has not been realized.

The present invention is accomplished to resolve the foregoing problems of the prior art.

It is an object of the present invention to provide a Viterbi decoding method suitable for performing a decoding by software, which can calculate data of the eight groups from data of one of the eight groups.

SUMMARY OF THE INVENTION

To achieve the foregoing object, in accordance with the present invention, there is provided a Viterbi decoding method comprised of the steps of receiving a signal representing a string of data at an nth time instant (where n is a positive integer), the string of data including a plurality of serial divisions each of which has a predetermined number of consecutive input data bits; transforming the received signal into a plurality of division signals representing respective serial divisions of consecutive input data bits; using a Trellis encoder for converting the division signal representing the input data bits of each division into a code signal representing consecutive Trellis code bits at the nth time instant; generating a branch metric signal representing a minimum Euclidean distance between a reception signal point corresponding to the received signal including a noise component and each of a plurality of signal points in a signal space diagram, which correspond to the code signals representing Trellis codes, at the nth time instant correspondingly to each of first to eighth states represented by three bits obtained in the Trellis encoder and also generating a reception-signal-point signal representing the reception signal point; generating a branch metric sum signal representing a sum of the minimum Euclidean distances corresponding to the first to eighth states, respectively, each of which is multiplied by a parameter, at the nth time instant and also generating a path metric signal representing a corresponding path metric at an (n−1)th time instant as a sum of the minimum Euclidean distances corresponding to a first time instant to the (n−1)th time instant, respectively; generating a signal representing a sum of the minimum Euclidean distance at the nth time instant and the path metric at the (n−1)th time instant correspondingly to each of the first to eighth states as a path metric signal representing the path metric corresponding to each of the first to eighth states at the nth time instant; determining the path metric signal representing a minimum one of the path metrics respectively corresponding to the first to eighth states at the nth time instant as an nth surviving path signal representing a part of a surviving path, which part corresponds to the nth time instant and similarly generating (n−1)th to first surviving path signals in that order; generating a signal representing a signal point at the first time instant from the first surviving path signal; and restoring a signal representing input data bits received at the first time instant from the signal representing the signal point at the first time, wherein the step of generating the branch metric signal and the reception-signal-point signal further includes the sub-steps of: classifying the signals corresponding to the signal points according to the three bits into eight groups; employing a signal of one of the eight groups as the signal of a reference group; storing data used to obtain from the signal of the reference group the signals of groups other than the reference group; and generating seven tables representing the signal points of the other groups on the basis of a reference table which represents the signal points of the reference group.

In one embodiment of the inventive Viterbi decoding method, when a branch metric sum signal is generated at the nth time instant, the parameter is a gain $\alpha$ less than 1.

Moreover, in another embodiment of the aforesaid Viterbi decoding method, the step of generating a signal representing a signal point at the first time instant includes the sub-steps of: storing a cyclic table having rows representing the first to eighth states and columns representing the first to nth time instants; writing a signal representing a jth signal point to a higher-order part of a cell of the table, corresponding to an ith state ($1 \leq 1 \leq 8$) and a jth time instant ($1 \leq j \leq n$); and writing signals representing coordinates of a signal point at a (j−1)th time instant, which is changed to the jth signal point at the jth time instant, to a lower-order part of the cell corresponding to an ith state and a jth time instant, wherein the column of the cyclic table corresponding to the first time instant is cyclically used in such a manner to correspond to an (n+1)th time instant.

Furthermore, in a further embodiment of this Viterbi decoding method, wherein the number n of the columns of the cyclic table representing the time instant is equal to 12.

Therefore, if a table of FIG. 15 is employed as the reference table among the tables of FIGS. 15 to 22, the signals points of the other tables can be obtained by rotating the signal points of the reference table around a reference plant or shifting the signal points of the reference table. Thereby, the tables other than the reference table can be calculated from the reference table. Consequently, the processing can be simplified.

Further, because the sum of the path metric at the time instant (n−1) and the value obtained by multiplying the branch metric at the time instant n by the gain α is computed when updating the path metric at the time instant n, the resultant value of the path metric can be made to be small if the gain α smaller than 1 is employed. Consequently, an occurrence of an overflow can be prevented.

Moreover, decoded data of the received or input data at the time instant 1 is obtained from the data received at the time instant n by using the cyclic table which has the rows representing the states 0 to 7 and the columns representing the time instants 1 to n, wherein at the time instant (n−1), the column corresponding to the time instant 1 is cyclically used. As a result, the size of the table used for a tracing of the surviving path can be compact. Additionally, the number n of the columns can be set to be variable. In such a case, if n=12, an appropriate balance between a precision in error correction and an operation load on the device can be obtained. Moreover, the processing can be further simplified. Furthermore, macroinstructions can be easily realized. In addition, a program used in the device can be easily corrected and modified.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which:

FIG. 2 is a diagram for illustrating an operation of the Trellis encoder;

FIG. 23 is a diagram for illustrating macroinstructions employed in an embodiment of the present invention;

FIG. 24 is a diagram for illustrating the contents of a V17DEC1 instruction;

FIG. 25(a) is a diagram for illustrating the contents of a table DECTBL to be stored in an external random access memory (RAM);

FIG. 25(b) is a diagram for illustrating the contents of another table MAPTBL to be stored in the RAM);

FIGS. 26(a) to 26(c) are diagrams for illustrating the formats employed in the V17DEC1 instruction;

FIGS. 27(a) and 27(b) are diagrams for illustrating the coordinate transformation of a reception signal point;

FIGS. 28(a) and 28(b) are diagrams for illustrating how the Euclidean distance between the reception signal point and a signal point closest thereto of each group;

FIG. 29 is a diagram for illustrating a VSTMIN macroinstruction;

FIG. 30 is a diagram for illustrating the structure of a Viterbi table;

FIG. 31 is a diagram for illustrating how the minimum value of a total of errors in case of a state 0;

FIGS. 33(a) to 33(d) are diagrams for illustrating the relation between operands LTOP and DTOP in each of states 0 to 3;

FIGS. 34(a) to 34(d) are diagrams for illustrating the relation between Operands LTOP and DTOP in each of states 4 to 7;

FIGS. 36(a), 36(b) and 36(c) are diagrams for illustrating an operation of executing the VTLDEC instruction.

DETAILED DESCRIPTION OF THE PREFERRED EMBODIMENT

Figure 1:
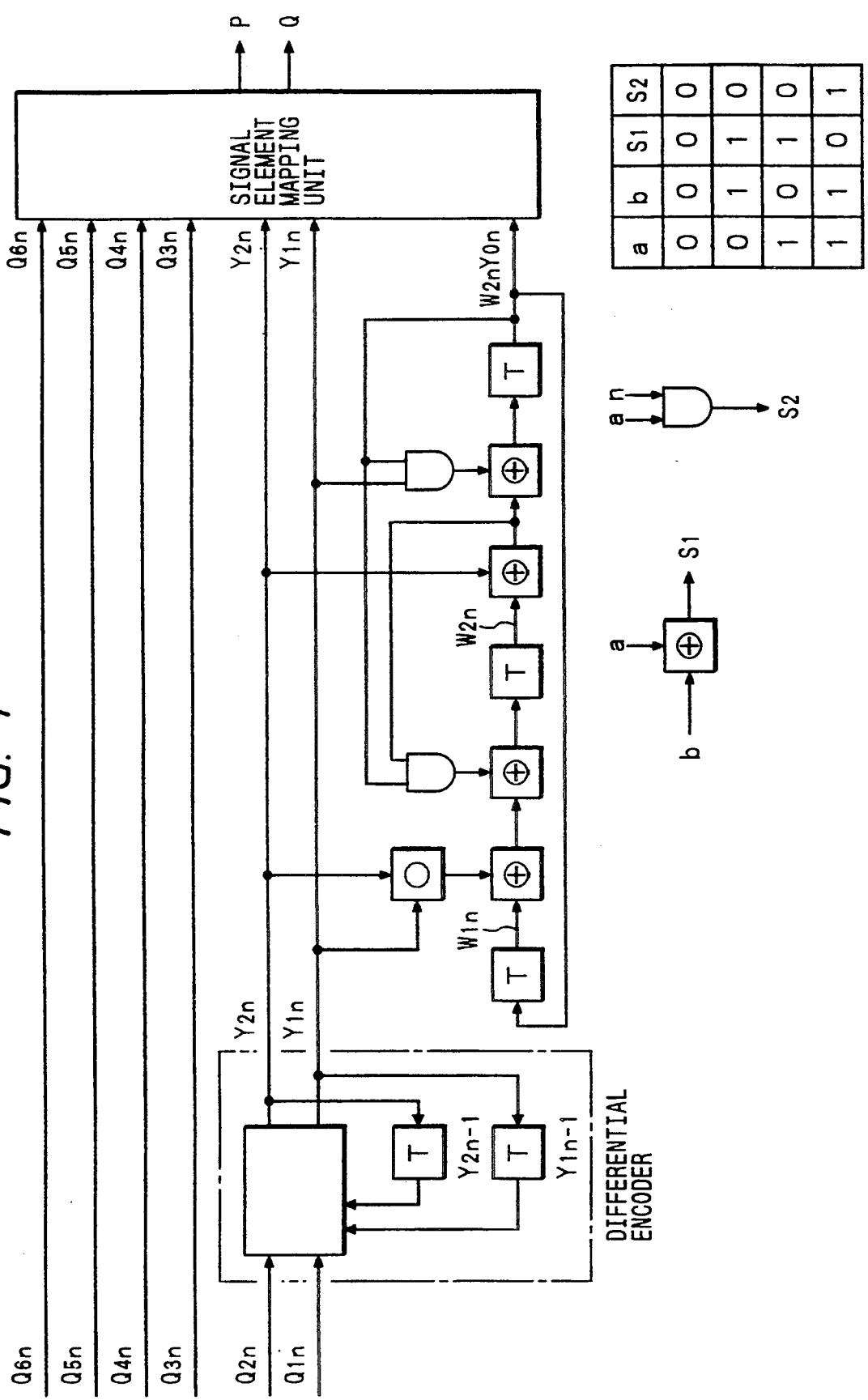
FIG. 1 is a schematic block diagram for illustrating the configuration of a Trellis encoder.
Figure 3:
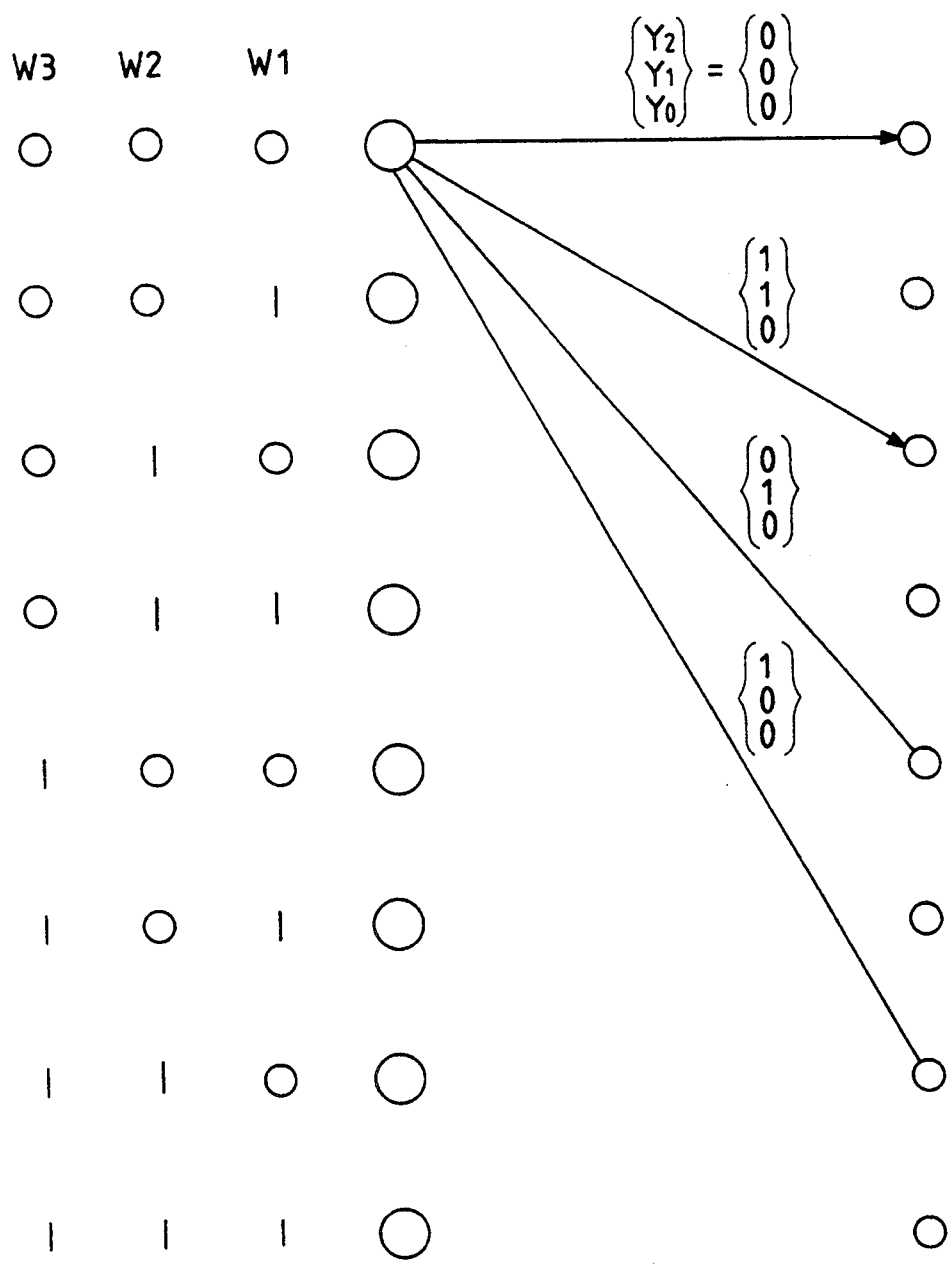
FIG. 3 is a transition diagram for illustrating state transitions from a state 1.
Figure 4:
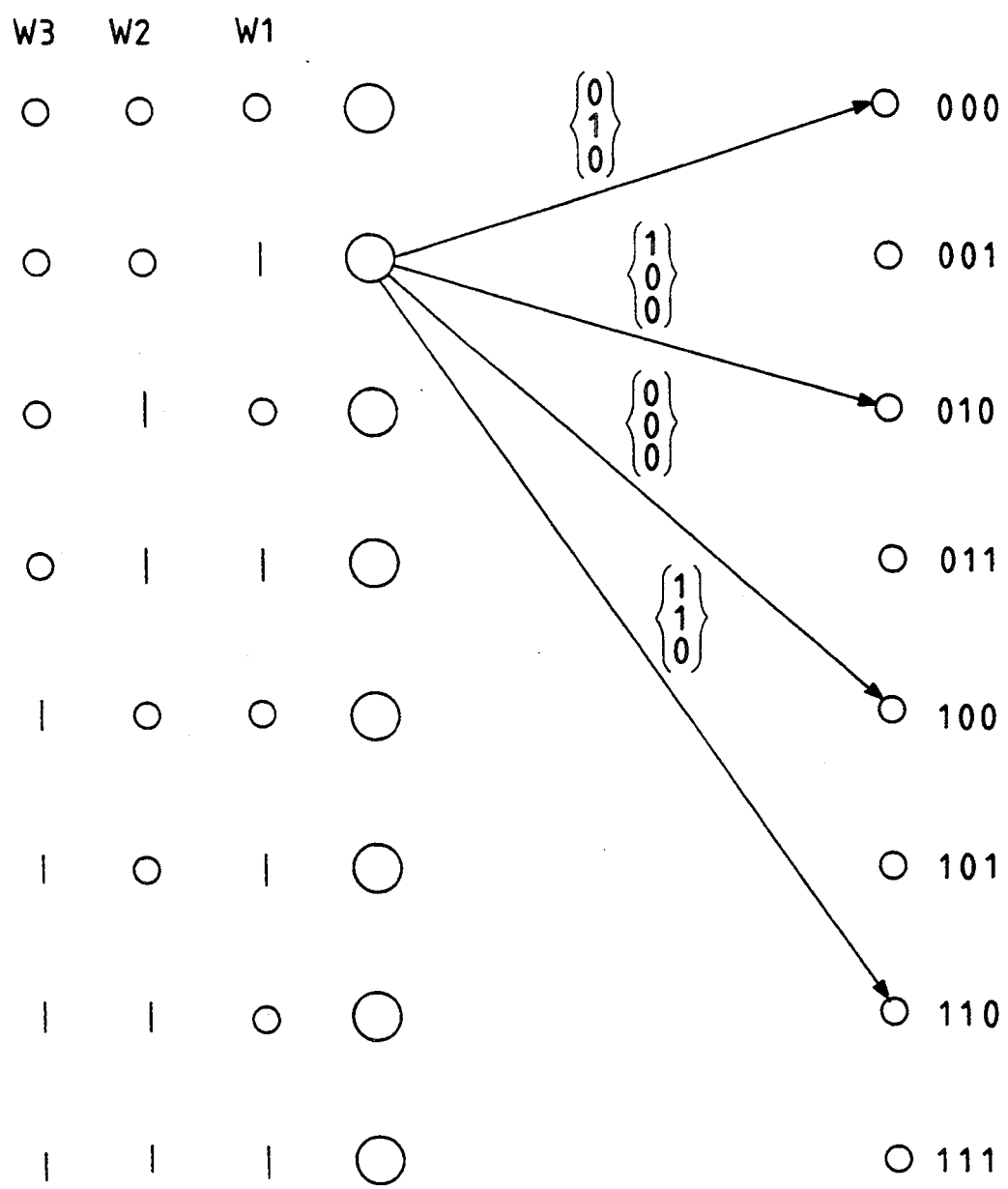
FIG. 4 is a transition diagram for illustrating state transitions from a state 2.
Figure 5:
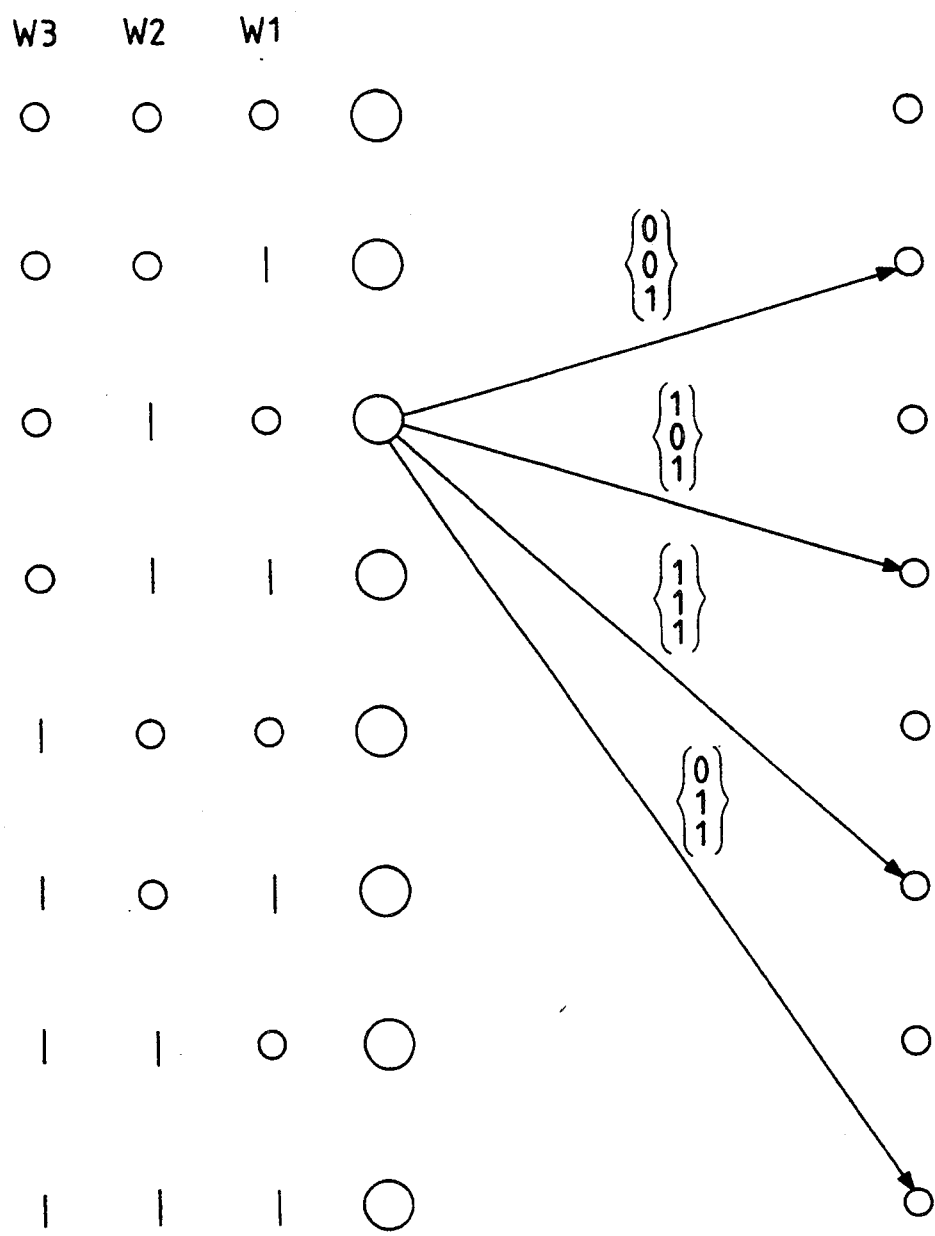
FIG. 5 is a transition diagram for illustrating state transition from a state 3.
Figure 6:
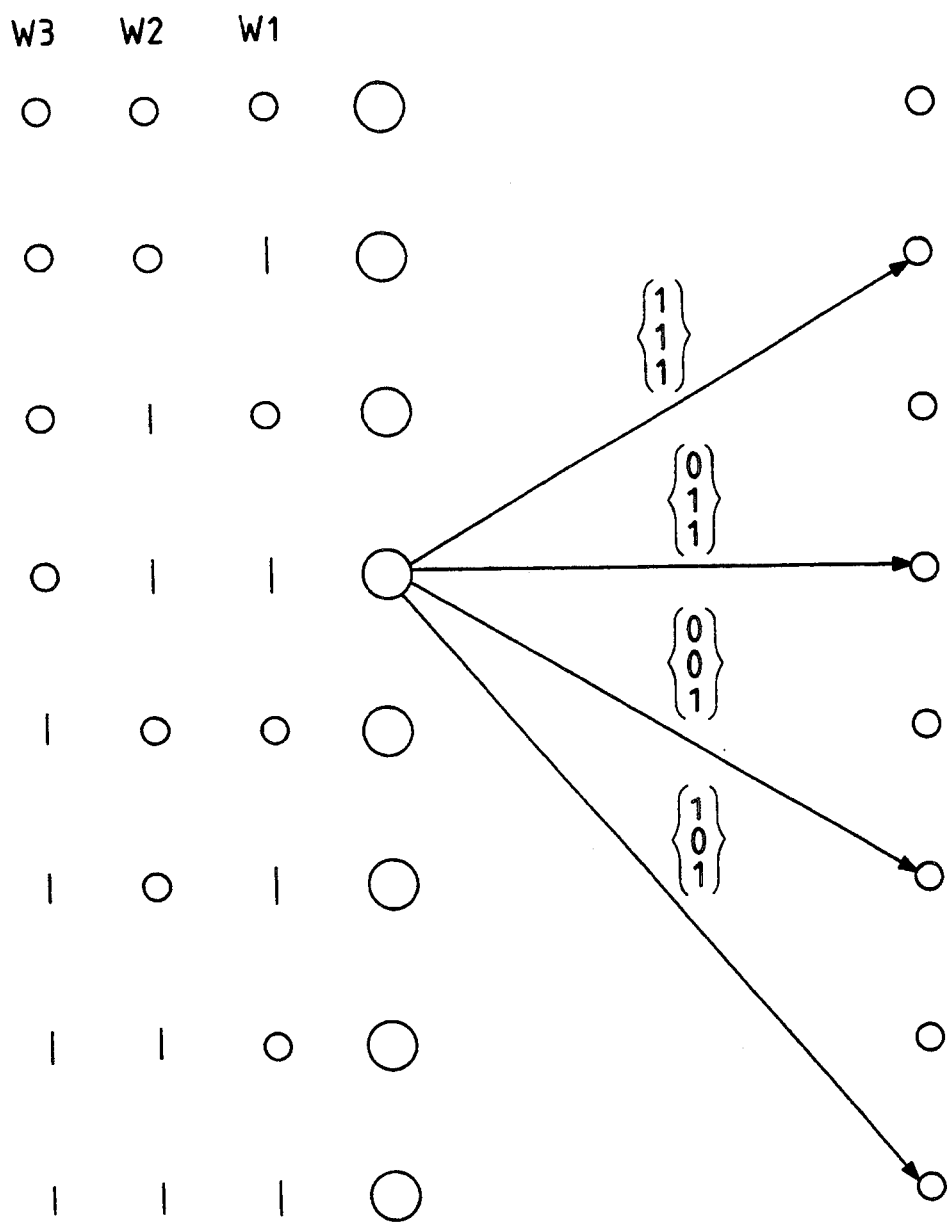
FIG. 6 is a transition diagram for illustrating state transition from a state 4.
Figure 7:
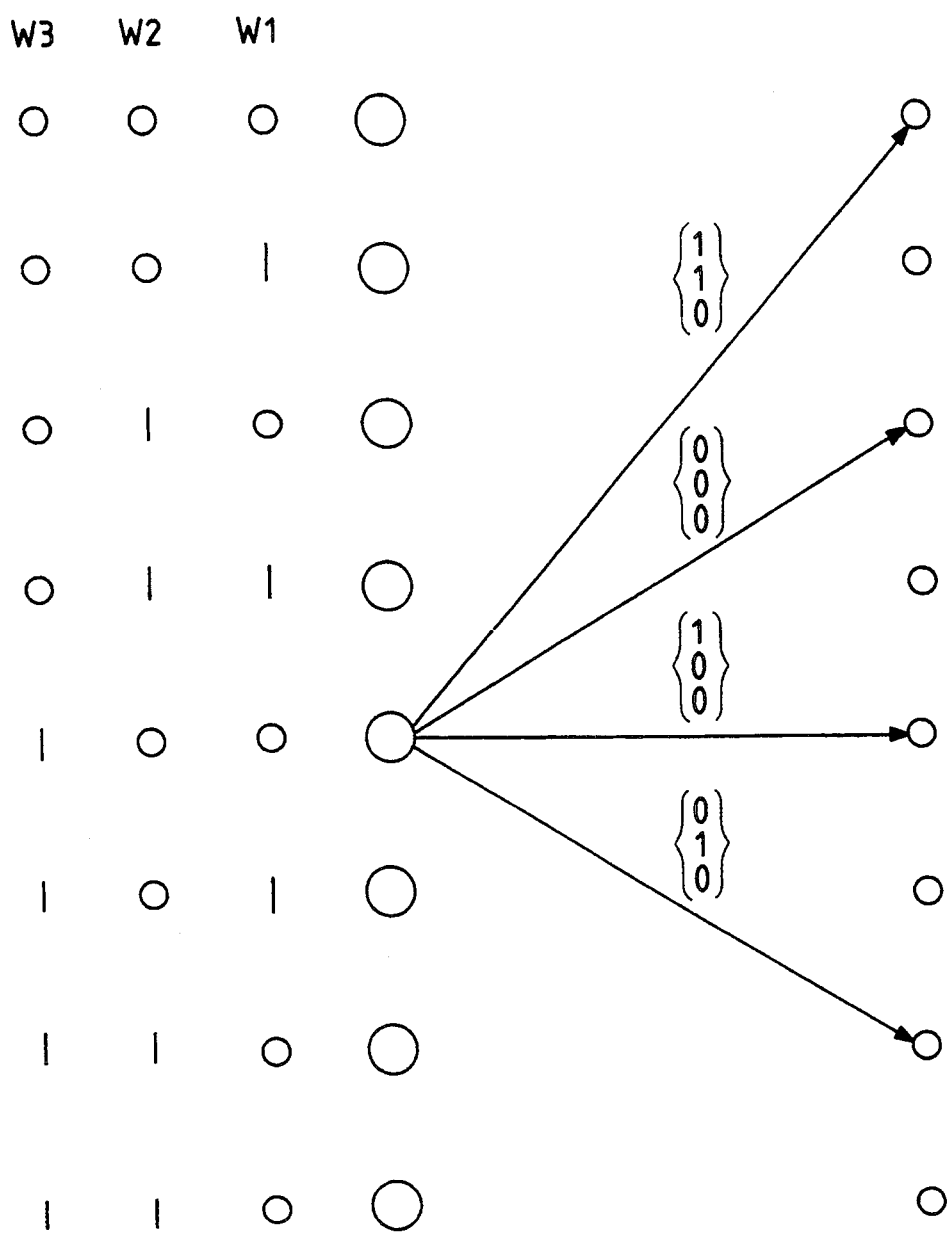
FIG. 7 is a transition diagram for illustrating state transitions from a state 5.
Figure 8:
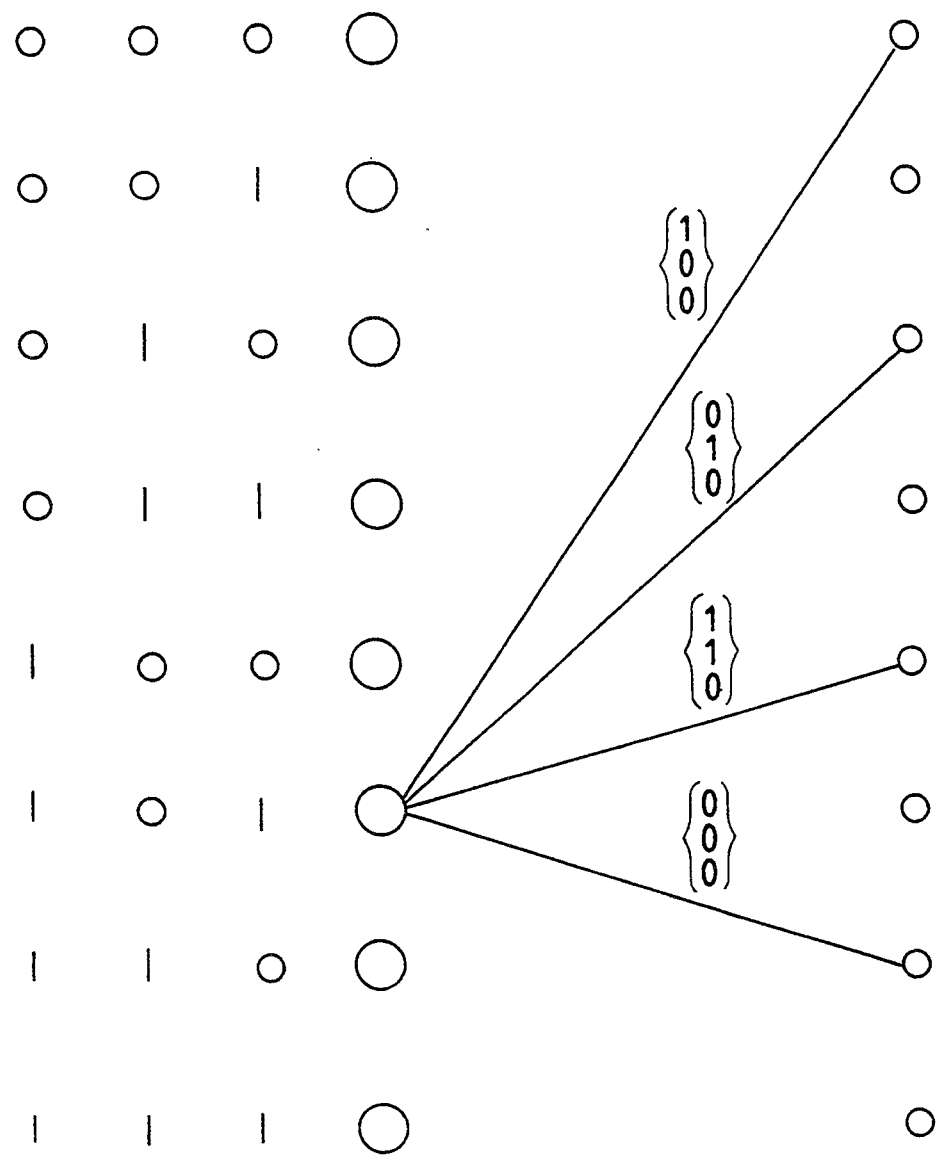
FIG. 8 is a transition diagram for illustrating state transitions from a state 6.
Figure 9:
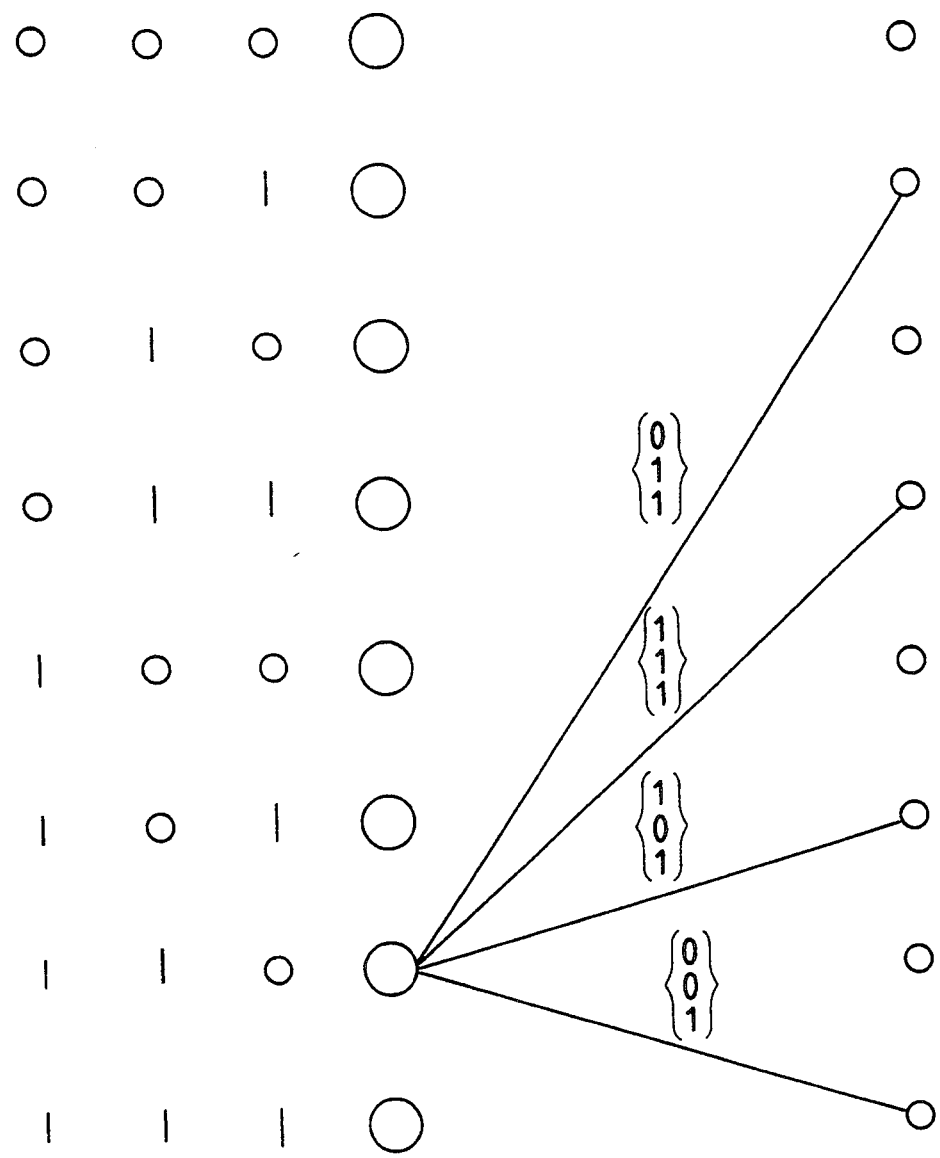
FIG. 9 is a transition diagram for illustrating state transitions from a state 6.

Hereinafter, the preferred embodiment of the present invention will be described in detail by referring to the accompanying drawings.

This embodiment is to receive Trellis-coded data and then perform a Viterbi-decoding of the received data by software using macroinstructions. In the prior art, the Viterbi decoding is effected by hardware. In contrast, in case of this embodiment, the prior art decoding method is improved in designing, defining and incorporating macroinstructions.

FIG. 23 illustrates macroinstructions employed in this embodiment of the present invention. Principal macroinstructions are a V17DEC1 instruction corresponding to each of groups 0 to 7 and used for performing a pre-decision for a decoding, a VSTMIN instruction corresponding to each of states 0 to 7 (to be described later) and used for determining the minimum value of a reception error and generating a backward pointer (to be described later) and a VTLDEC instruction for eventually determining output data. Hereinafter, these macroinstructions will be described in detail.

FIG. 24 illustrates the contents of the V17DEC1 instruction. An operand V2 represents data RDECIN and IDECIN which are input to the Viterbi decoder 11 and are the Re-axis (X-axis) data representing X-coordinate of the reception signal point and the Im-axis (Y-axis) data representing Y-coordinate thereof, respectively. The details of the data RDECIN and IDECIN are illustrated in FIG. 26(b). Further, the highest eight bits of sixteen bits composing each of these data are used to represent the contents of each of these data.

Further, one of the tables of FIGS. 15 to 22 respectively corresponding to the groups 0 to 7 is determined as a reference table. Column Z2 is used to determine and calculate rotation coefficients (namely, COS $\theta$ and SIN $\theta$ (incidentally, $\theta$ denotes an angle of rotation)) and the offsets x and y of each of the other tables from the reference table correspondingly to each of group Nos. (namely, 0 to 7). Column M3 stores a leading address of a table DECTBL of FIG. 25(a) therein. Column V3 stores a leading address of a table MAPTBL of FIG. 25(b) therein. In FIG. 25, a rightmost column V2 stores data CODE representing a closest signal point of each group, which is closer to the reception signal point than any other signal points of the corresponding group shown in a corresponding one of FIGS. 15 to 22, and data representing the distance between the closest signal point of each group and the reception signal point therein.

Additionally, in the column Z2, the group Nos. of from 0 to 7 are doubly indicated as follows. For example, in case that a group No. is 7, a value 0707 in hexadecimal representation is indicated therein. Further, in case that a group No. is 1, a value 0101 is indicated therein. Furthermore, in case of accessing an external RAM, if FFFF is indicated as an external RAM U/L code, an upper part (to be described later) of each code or data CODE stored in the external RAM is accessed. In contrast, if 0000 is indicated, a lower part (to be described later) of the data CODE stored in the external RAM is accessed.

Figure 11:
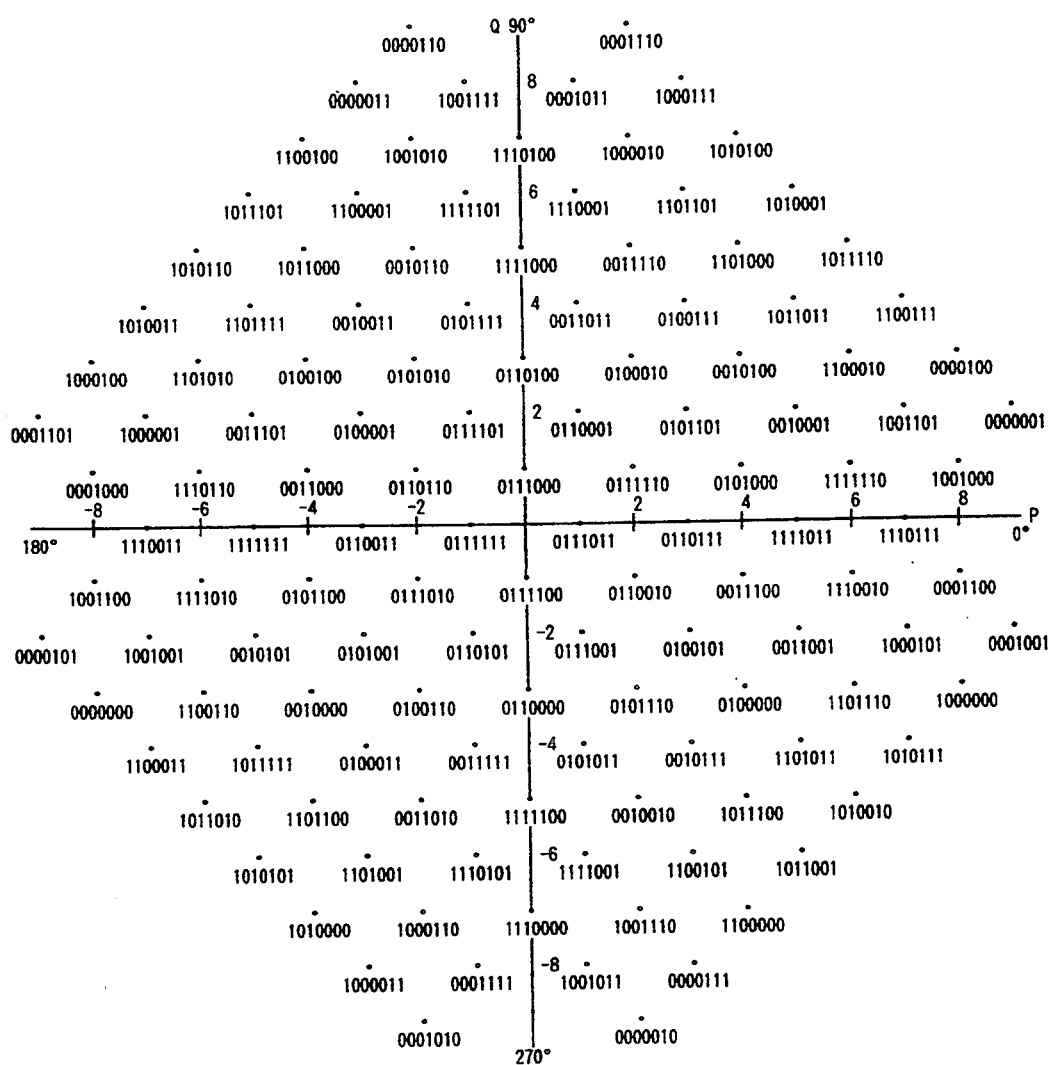
FIG. 11 is a signal space diagram for illustrating Trellis Coded Modulation in case of a 14,400-bps operation.
Figure 12:
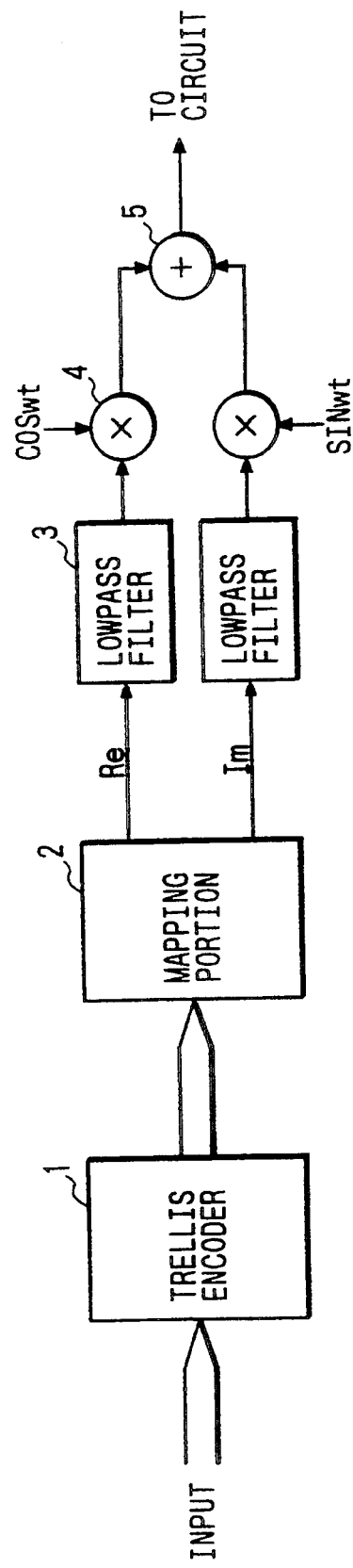
FIG. 12 is a schematic block diagram for illustrating the configuration of hardware from the Trellis encoder to the device for outputting a coded signal to the circuit or line.
Figure 13:
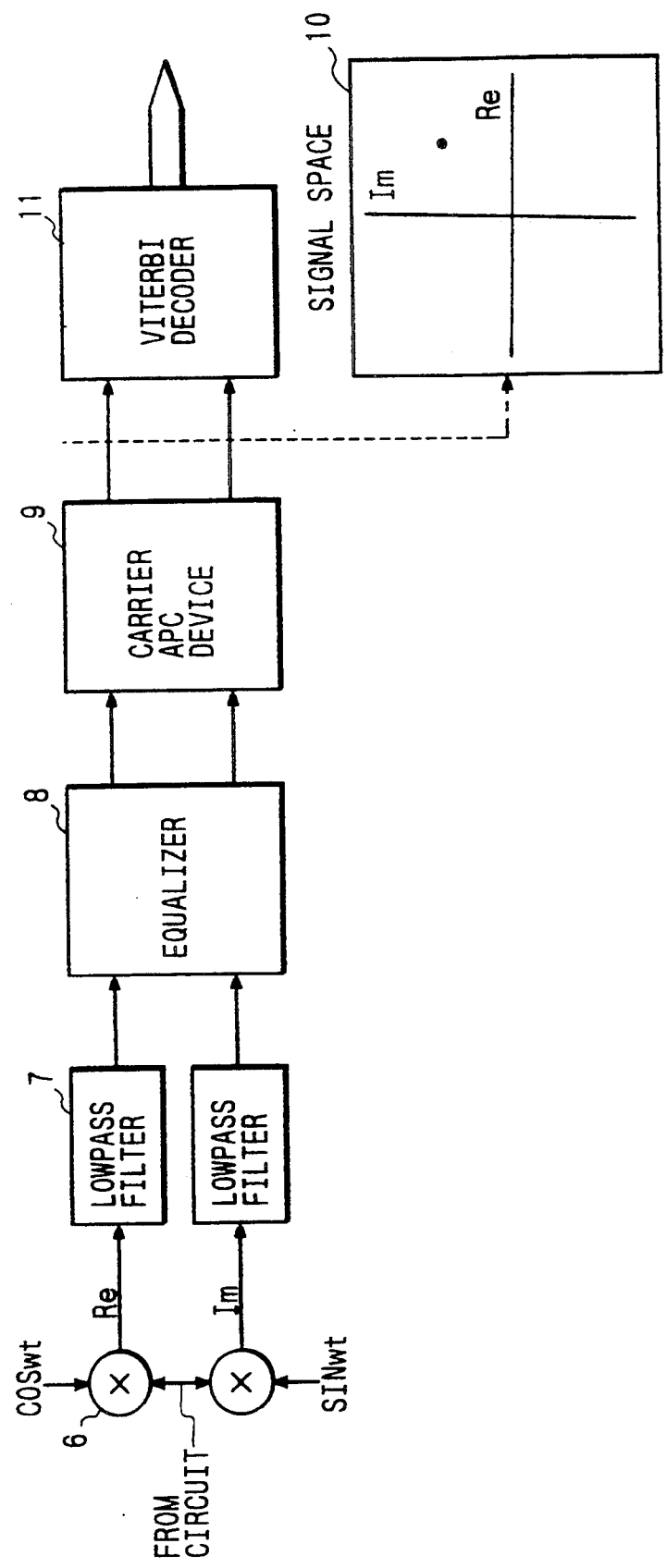
FIG. 13 is a schematic block diagram for illustrating the configuration of hardware for receiving an input coded signal from the circuit or line and decoding the input coded signal by means of a Viterbi decoder to obtain output data.
Figure 14:
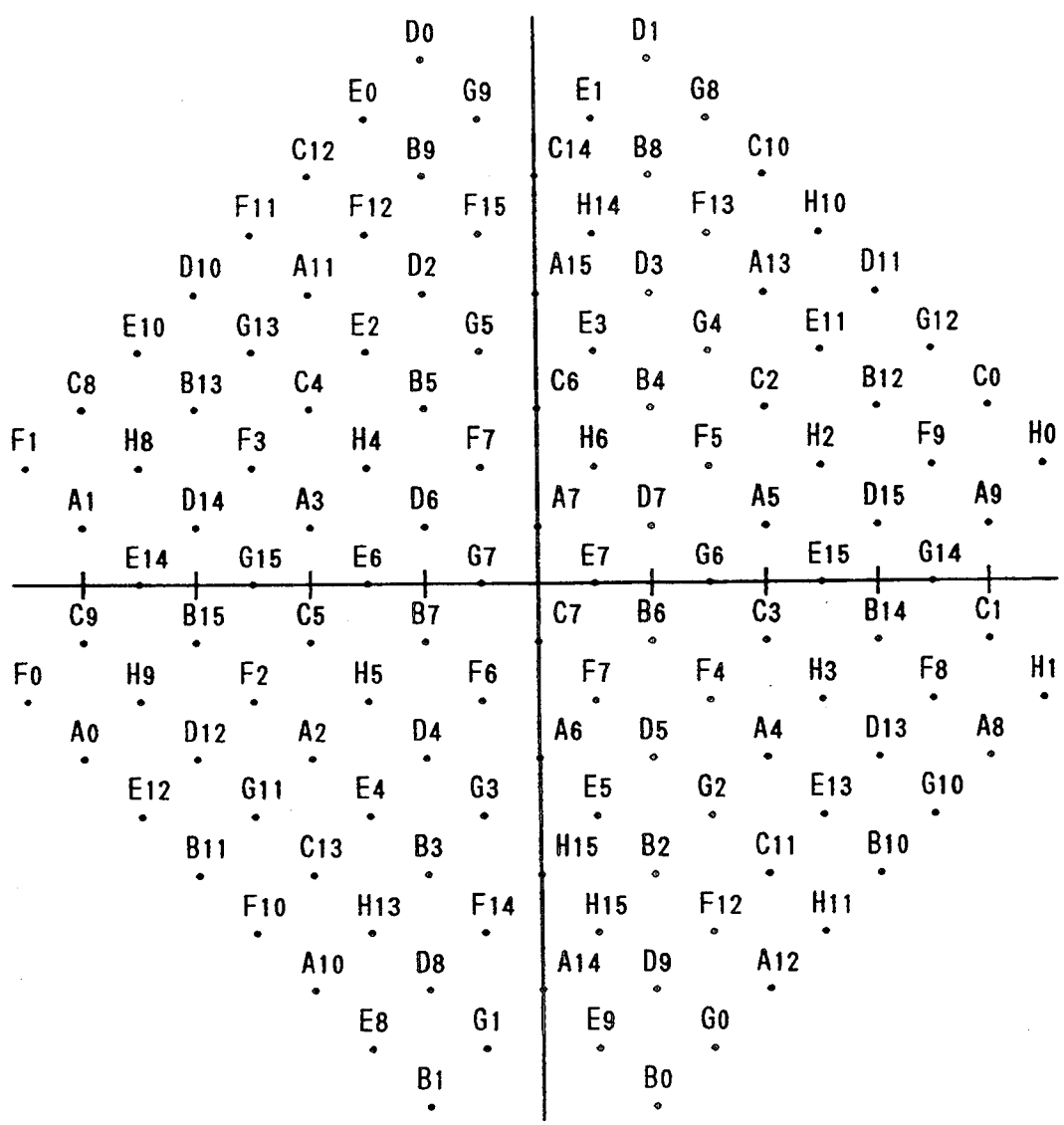
FIG. 14 is a diagram for illustrating signal points of FIG. 11 classified into eight groups A to H.
Figure 15:
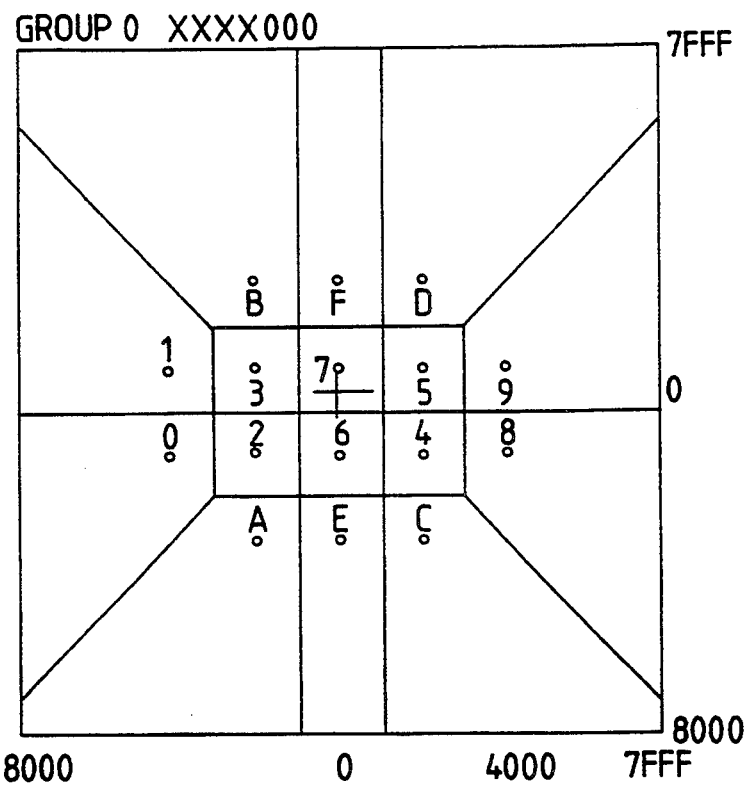
FIG. 15 is a signal space diagram for illustrating signal points of a group 0 (namely, the group A)
Figure 16:
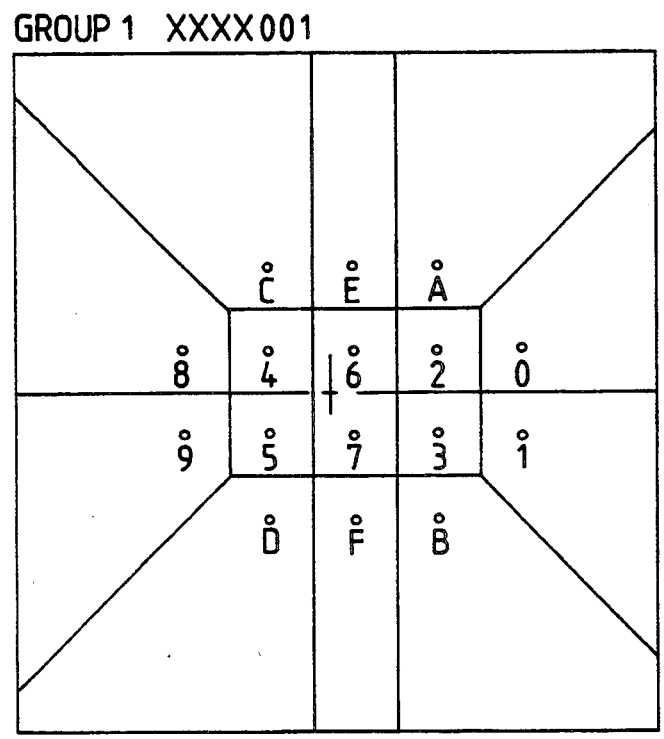
FIG. 16 is a signal space diagram for illustrating signal points of a group 1 (namely, the group H)
Figure 17:
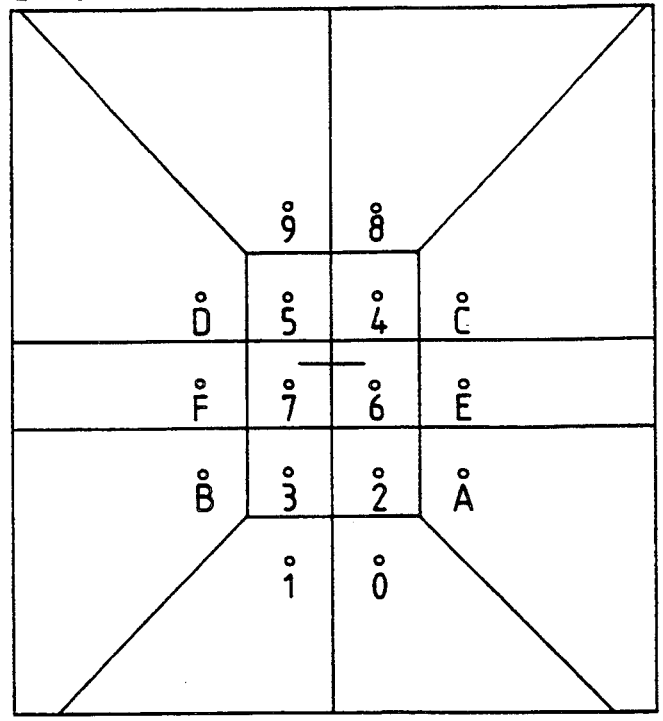
FIG. 17 is a signal space diagram for illustrating signal points of a group 2 (namely, the group B)
Figure 18:
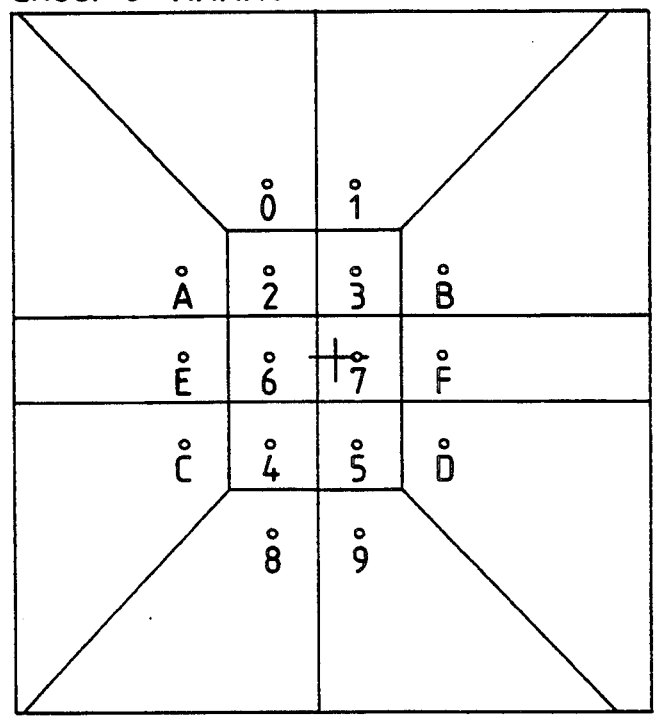
FIG. 18 is a signal space diagram for illustrating signal points of a group 3 (namely, the group E)
Figure 19:
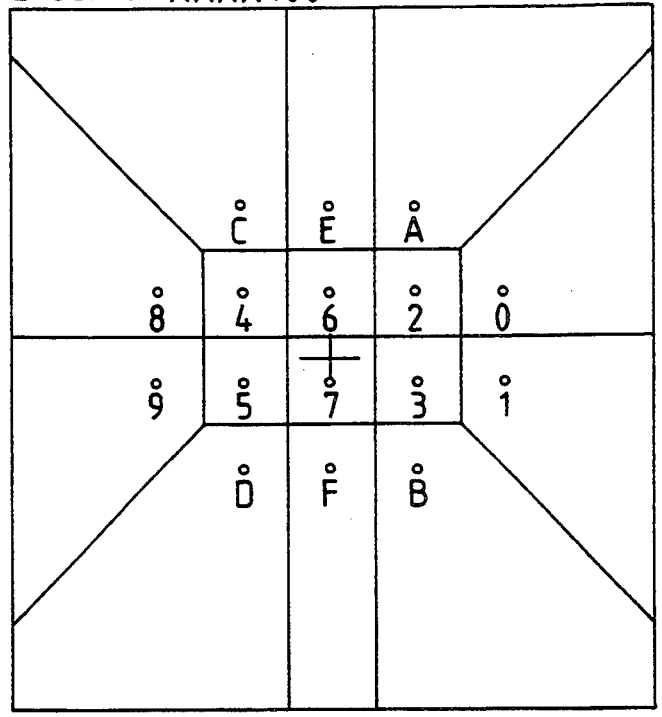
FIG. 19 is a signal space diagram for illustrating signal points of/a group 4 (namely, the group C)
Figure 20:
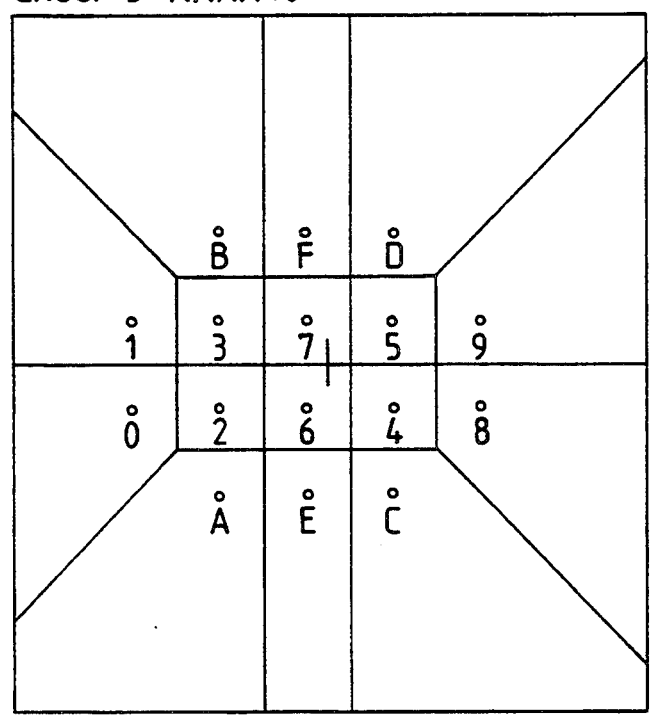
FIG. 20 is a signal space diagram for illustrating signal points of a group 5 (namely, the group F)
Figure 21:
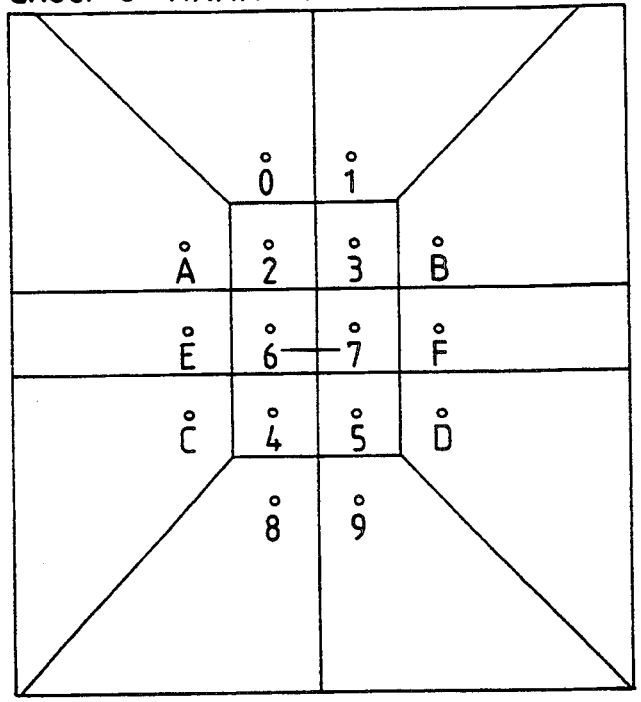
FIG. 21 is a signal space diagram for illustrating signal points of a group 6 (namely, the group D)
Figure 22:
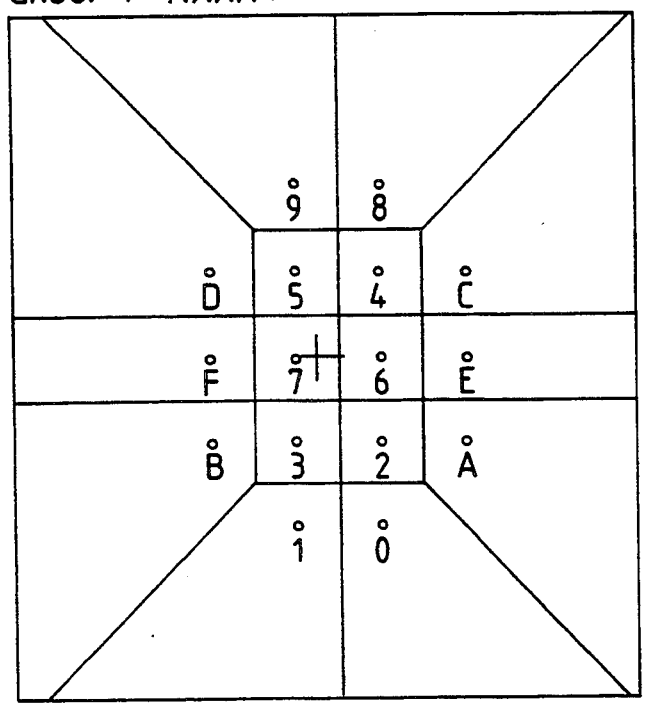
FIG. 22 is a signal space diagram for illustrating signal points of a group 7 (namely, the group G)

FIG. 25(a) illustrates a state of the table DECTBL in which data CODE respectively representing the 128 signal points (namely, the Trellis codes (hereunder sometimes abbreviated as TC)) of FIG. 11 are stored. Further, FIG. 25(b) illustrates how data regarding the mapped positions of the 128 signal points represented by the data CODE in the signal space diagram, which shows the Trellis codes, is stored in the table MAPTBL. Namely, data DECR represents X-coordinate of a signal point in the signal space; data DECI Y-coordinate thereof; and data NCR and NCI corresponding angles from a reference point. Each of these data DECR, DECI, NCR and NCI is two bytes long. Thus the position of each signal point is represented by using a total of 8 bytes.

FIG. 26(a) is a diagram for illustrating the format of the data CODE, which is represented by $Q_6Q_5Q_4Q_3/Q_6Q_5Q_4Q_3$, stored in the table DECTBL. Further, for instance, in case of 14.4-kbps (kilobits per second) transmission or in case where TC is 96, an upper part (namely, upper quadbits $Q_6Q_5Q_4Q_3$) of the data CODE is employed. In contrast, for example, in case of 12.0-kbps transmission or in case where TC is 72, a lower part (namely, lower quadbits $Q_6Q_5Q_4Q_3$) of the data CODE is employed. FIG. 26(b) illustrates the formats of the data RDECIN and IDECIN. Namely, as shown in this figure, higher-order one of two bytes is assigned to the data bits $X_7 \sim X_0$ and $Y_7 \sim Y_0$ of the data RDECIN and IDECIN. FIG. 26(c) illustrates the format of data CTOP representing a TC or signal point of each group, which is closest to the reception signal point. Namely, the TC corresponding to the closest point of each group has the format represented by $0Q_6Q_5Q_4Q_3Y_2Y_1Y_0$. Incidentally, the consecutive three bits $Y_2Y_1Y_0$ represent a corresponding group No.

Figure 10:
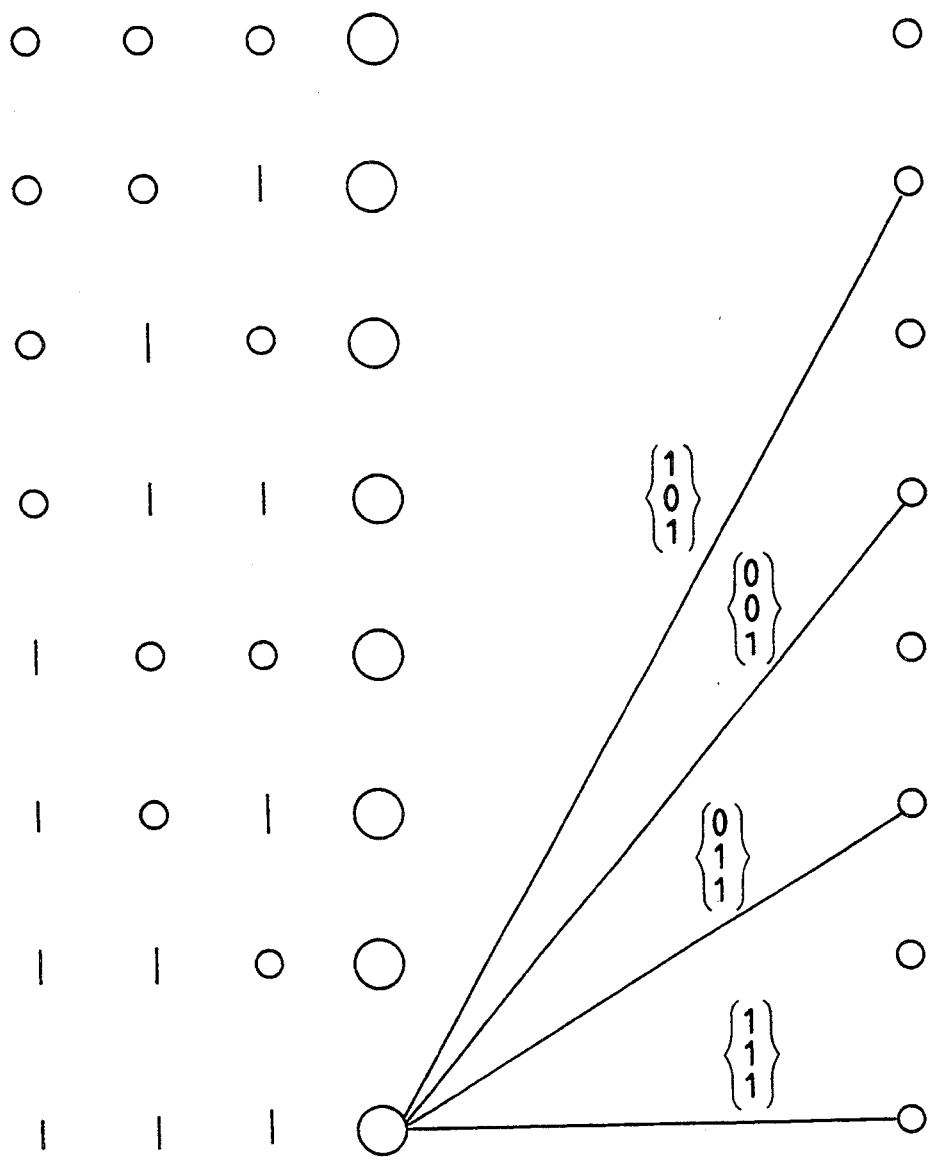
FIG. 10 is a transition diagram for illustrating state transitions from a state 8.

Next, an operation of executing the macroinstruction V17DEC1 will be described hereinbelow. First, the Re-axis and Im-axis coordinates of the reception signal with respect to the reference table, which are represented by the data RDECIN and IDECIN, respectively, are transformed into X-coordinate and Y-coordinate thereof corresponding to each of the groups (namely, groups 0 to 7). FIG. 27(a) indicates a transformation formula employed for effecting such coordinate transformations. In this figure, characters X and Y represent X-coordinate and Y-coordinate (hereunder sometimes referred to as converted X-coordinate and Y-coordinate, respectively) obtained as the result of the coordinate transformation. Then, as illustrated in FIG. 27(b), 10 consecutive data bits $X_7X_6X_5X_4X_3Y_7Y_6Y_5Y_4Y_3$ are generated from the converted X-coordinate comprised of bits $X_7X_6X_5X_4X_3X_2X_1X_0$ and the converted Y-coordinate consisting of bits $Y_7Y_6Y_5Y_4Y_3Y_2Y_1Y_0$. Subsequently, the corresponding data CODE is read by accessing locations of the external RAM from an address obtained by adding the 10-bit data $X_7X_6X_5X_4X_3Y_7Y_6Y_5Y_4Y_3$ to the leading address of the table DECTBL of the FIG. 25(a). Further, the upper or lower part (namely, the upper or lower consecutive data bits $Q_6Q_5Q_4Q_3$) of the data CODE of FIG. 26(a) corresponding to each group is selected and then the corresponding group No. represented by the bits $Y_2Y_1Y_0$ (indicated by characters G0 to G7 in this figure) is added to the selected upper or lower part of the data CODE of each group. Moreover, resultant data $0Q_6Q_5Q_4Q_3/Y_2Y_1Y_0$ obtained as a result of the addition corresponding to each group is stored or held as data CTOP of FIG. 24. Next, to obtain the coordinates of the resultant data of each group, the data DECR and DECI are read by accessing the table MAPTBL from an address obtained by adding addend data $(Q_6Q_5Q_4Q_3Y_2Y_1Y_0)*8$ to the leading address of the table MAPTBL of FIG. 25(b). The reason why the data represented by the bits $Q_6Q_5Q_4Q_3Y_2Y_1Y_0$ is multiplied by 8 to obtain the addend data is as follows. Namely, as previously explained by referring to FIG. 25(b), data regarding the position of a single signal point is represented by using 8 bytes. Thus the coordinate data DECR of a signal point (namely, a code represented by the bits $Q_6Q_5Q_4Q_3Y_2Y_1Y_0$) are stored every bytes of the number which is eight times the address of the code in the table DECTBL. Then, the Euclidean distance between the X and Y coordinates DECR and DECI of the closest signal point (or Trellis code) of each group in the signal space diagram and those RDECIN and IDECIN of the reception point (namely, the expression $\{(\text{RDECIN}-\text{DECR})^2+(\text{IDECIN}-\text{DECI})^2\}$) is evaluated. The calculated Euclidean distance corresponding to each group is stored as data DTOP in the column V2 of FIG. 24. FIGS. 28(a) and 28(b) describe the processes stated hereinabove.

Next, the VSTMIN macroinstruction will be described hereinbelow. FIG. 29 illustrates the configuration of the VSTMIN macroinstruction. A column STATE indicates one of the states 0 to 7 represented by the bits $W_{3n}W_{2n}W_{1n}$. Further, a row DTOP indicates the value of the data DTOP of FIG. 24. Furthermore, columns L1, L2, L3 and L4 represent the four states as shown in FIGS. 3 to 10, into which the state of the reception signal point may change from that thereof at a time instant (n−1). The Euclidean distance represented by the data DTOP is called a partial error or a branch metric. A total error (or path metric) is a sum of the branch metrics corresponding to each state when the state of the reception signal point changes from a time instant 1 to the time instant n according to change in value indicated by the bits $W_{n3}W_{n2}W_{n1}$ (Or $W_{3n}W_{2n}W_{1n}$).

A table "LTOP TABLE" stores a total error corresponding to each state. Further, data "LTOP P" indicates the leading address of the table "LTOP TABLE". Moreover, data PTOP is a pointer indicating a reception signal point (or Trellis code) deduced at the time instant (n−1) and a reception signal point deduced at a time instant (n−2) which is changed to the reception signal point deduced at the time instant (n−1). Furthermore, data "PTOP C" is a pointer indicating a reception signal point deduced at the time instant n and a reception signal point deduced at the time instant (n−1) which is changed to the reception signal point deduced at the time instant n. Additionally, a column WORK stores the minimum one of the total errors (or the sums of the partial errors).

FIG. 30 illustrates a cyclic (or ring-structured) Viterbi table, of which the rows indicates the states 0 to 7 and the columns indicate the pointers PTOP.

Next, an operation of executing the VSTMIN macroinstruction will be described hereinbelow.

FIG. 31 illustrates a method for obtaining the minimum value of the total error at the time instant n in case of the state 0 by way of example. Here, it is assumed that in each of FIGS. 3 to 10, states at the time instant n are shown on the right side thereof and states at the time instant (n−1) are shown in the left side thereof. Then, the groups, each of which is signal points, which may become state 0 at the time instant n, are the following four groups each represented by the bits $Y_2Y_1Y_0$, namely, a 000-group (i.e., a group 0) of FIG. 3, a 010-group (i.e., a group 2) of FIG. 4, a 110-group (namely, a group 6) of FIG. 7 and a 100-group (i.e., a group 4) of FIG. 8. The branch metrics respectively corresponding to these groups are found as values indicated by the elements DTOP(0), DTOP(2), DTOP(6) and DTOP(4) of the table DTOP. Further, it is seen from FIG. 3 that an origin or source state represented by the bits $W_3W_2W_1$, at the time instant (n−1), from which the transition to a state 0 at the time instant n occurs, is a state 0. Further, the total error corresponding to the state 0 is found from the element LTOP(0) of FIG. 29. Moreover, it is seen from FIG. 4 that an origin corresponding to the element DTOP(2) (namely, a source of the transition to the state 0 of the group 2 at the time instant n) is a state 1 at a time instant (n−1). Thus, the total error corresponding to the state 0 is found from the element LTOP(1). Similarly, it is seen from FIG. 7 that an origin of the transition to the state 0 of the group 8 corresponding to the element DTOP(8) is a state 4 at the time (n−1). Thereby, the total error corresponding to the state 0 is found from the element LTOP(4). Furthermore, it is seen from FIG. 8 that an origin of the transition to the state 0 of the group 4 corresponding to the element DTOP(4) is a state 5 at the time (n−1). Consequently, the total error corresponding to the state 0 is found from the element LTOP(5).

Figure 32:
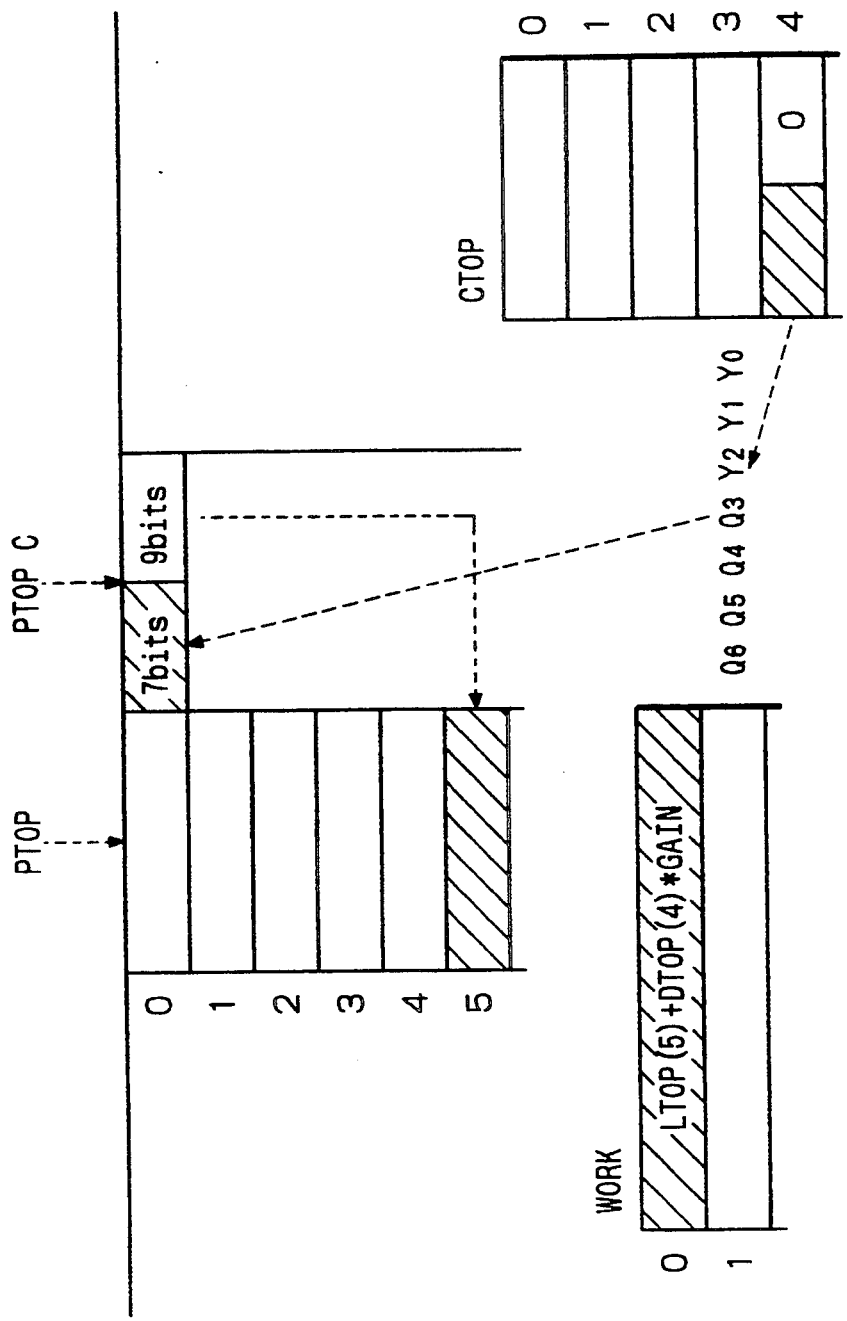
FIG. 32 is a diagram for illustrating data to be stored in the Viterbi table.

When the data DTOP corresponding to each group is added to the corresponding data ETOP to obtain the total error of a corresponding group, the data DTOP is first multiplied by a parameter GAIN, which is usually $\frac{1}{2}$ or $\frac{1}{4}$ and is used for preventing an overflow from occurring in computing the total error, and then a result of such a multiplication is added to the corresponding data LTOP. Further, among the sums of the data DTOP multiplied by the parameter GAIN and the corresponding data LTOP, a minimum one is stored in the column WORK. In this case, among four kinds of the sum, the minimum sum {LTOP(5)+DTOP(4)-*GAIN} is stored in the column WORK. Namely, it is determined that the data LTOP(5) and DTOP(4) gives the minimum total error in the state 0 at the time instant n. Thereby, it is turned out that the code $Q_6Q_5Q_4Q_3Y_2Y_1Y_0$ corresponding to the reception signal point, which gives the minimum total error in the state 0 at the time instant n, is the code CTOP(4) of FIG. 24 corresponding to the data DTOP(4). Thus, it is further found from the LTOP(5) that an origin of the transition to the state 0 is the state 5 at the time instant (n−1). Consequently, as illustrated in FIG. 32, the code $Q_6Q_5Q_4Q_3Y_2Y_1Y_0$ held in the element CTOP(4) is stored in a 16-bit cell corresponding to the row STATE 0 and the column "PTOP C" of FIG. 30 as the highest 7 bits thereof. Further, in accordance with the element LTOP(5), the pointer indicating the state 5 at the time instant (n−1) is stored in this cell as the subsequent 9 bits (namely, the lowest 9 bits) thereof. Thereby, it is found that the state 0 at the time instant n is changed from the state 5 at the time instant (n−1). Similarly to this, an origin or source state at a time instant (n−2) of the transition to each state at the time instant (n−1) can be traced back by referring to the pointer. Thus, finally, an origin at the time instant 1 can be traced back by referring to the pointer. Consequently, the code $Q_6Q_5Q_4Q_3Y_2Y_1Y_0$ at the time instant 1 can be obtained.

FIG. 30 illustrates a Viterbi table which has a cyclic structure. Further, the next column on the right side of the column "PTOP C" thereof corresponding to the time instant n stores data (namely, the code $Q_6 \sim Q_3Y_2Y_1Y_0$ and a pointer) corresponding to the time instant 1. Furthermore, upon completion of inputting the reception signal point (namely, the corresponding Trellis cede) at the time instant n thereto, decoded data corresponding to the reception signal point at the time instant 1 is output therefrom. Thereby, the size of the table can be reduced to the irreducible minimum.

FIGS. 33 and 34 illustrate the relation between the data DTOP and LTOP corresponding to each state. Namely, a state at the time instant (n−1), which becomes an origin of a transition to another state at the time instant n, is determined as is seen from these figures. The relations illustrated in FIGS. 33 and 34 can be easily introduced from FIGS. 3 to 10.

Figure 35:
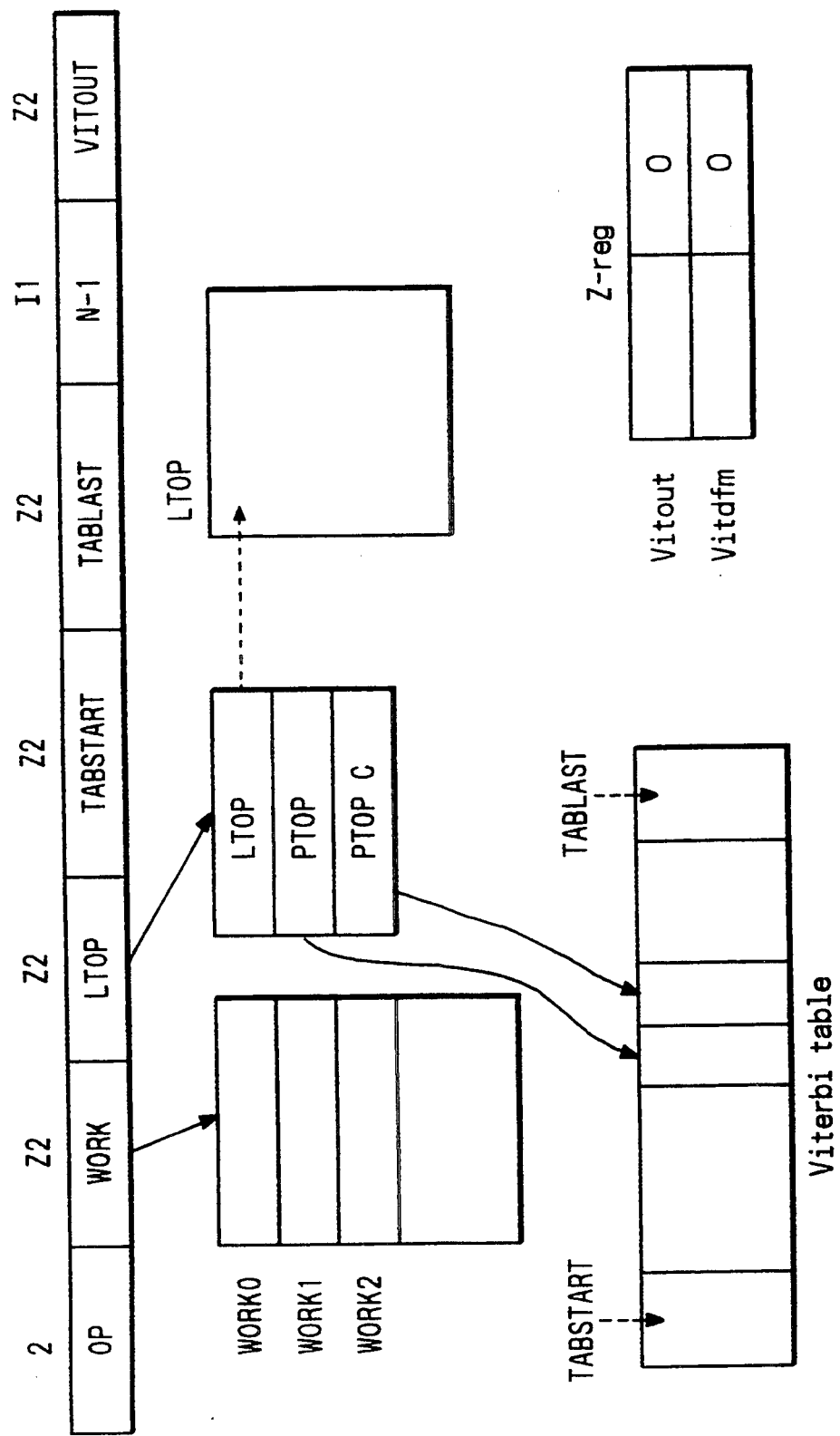
FIG. 35 is a diagram for illustrating the format of a VTLDEC instruction.

Next, the VTLDEC macroinstruction for obtaining decoded data will be described hereinbelow. FIG. 35 illustrates the format of the VTLDEC instruction. Data WORK thereof indicates an address of the table or column WORK described by referring to FIG. 31, in which the minimum one of the total errors (or the sums of the partial errors) corresponding to each state is stored. A column LTOP stores data LTOP indicating an address of the table "LTOP TABLE" described with reference to FIGS. 31 and 32 and an address of the cyclic table of FIG. 30 at which are stored the data PTOP and "PTOP C" corresponding to the data. In the cells of the table "LTOP TABLE", the total errors corresponding to the states 0 to 7 are respectively stored. If the value of each of the total errors becomes large, an overflow may occur. Thus, to prevent an occurrence of such an overflow, the minimum total error is set as zero. Namely, the value of the minimum total error is subtracted from that of the total error correspondingly to each state. Further, data TAB-START indicates a starting column of the Viterbi table of FIG. 30 and data TABLAST indicates a terminating column thereof. Moreover, data $(N-1)$ indicates that there are N tables, namely, the table 0 to $(N-1)$. Thus, the value of N can be set therein. Furthermore, data VITOUT represents decoded data obtained from the Viterbi table of FIG. 30.

Next, an operation of executing the VTLDEC macroinstruction will be described hereinbelow. First, the minimum one of the total errors corresponding to each state, which is obtained by calculating (LTOP+-DTOP*GAIN), is stored in the column or table WORK of FIG. 31. Thus, a state, the corresponding minimum one of the total errors of which is smaller than any other minimum ones of the total errors respectively corresponding to the other states is detected or found from the data stored in the table WORK of FIG. 31. Subsequently, the code $Q_6Q_5Q_4Q_3Y_2Y_1Y_0$ at the time instant 1 is traced back according to the pointer "PTOP C" corresponding to the detected state and the value of the code at the time instant 1 detected as the result of the tracing is stored in a register Z-reg. As shown in FIG. 35, the register Z-reg holds values of data Vitout and Vitdfm, the contents of which are illustrated in FIG. 36(a). Namely, the data Vitout and Vitdfm have the formats of FIG. 36(a) are held at the highest 8 bits of the register Z-reg. The data Vitdfm is data input to the Trellis encoder of FIG. 1. Further, the data Vitout is data output therefrom. Furthermore, the data Vitdfm can be obtained from the data Vitout by converting the bits $Y_2Y_1Y_0$ to the bits $Q_2Q_1$, namely, performing an inverse transformation of the transformation effected by the differential encoder of FIG. 1. Such an inverse transformation is obtained by the relation between the input and output data illustrated in FIG. 2. FIG. 36(b) illustrates a method for performing such an inverse transformation.

Thus, when the reception signal point (namely, the corresponding Trellis code) is input at the time instant n, a decoded signal representing the decoded data $Q_6Q_5Q_4Q_3Q_2Q_1$, which corresponds to the reception signal point at the time instant 1, can be obtained from the input reception signal point.

FIG. 36(c) summarizes an operation of executing the VTDEC macroinstruction. First, the minimum one (hereunder sometimes referred to as the minimum total error) of the values stored in the cells WORK0 to WORK7 of the table WORK is normalized to zero. After the normalization, each of the values stored in the cells of the table WORK is copied onto the table LTOP. Subsequently, the reception signal point is obtained by performing what is called an N-baud-rate back tracing according to the pointer "PTOP C" corresponding to the state having the minimum total error. As a result, the data Vitout is output. Then, the output data Vitout is converted into the data Vitdfm. Thus, a decoding is completed. Thereafter, the pointers PTOP and "PTOP C" are updated for the next processing or decoding.

While a preferred embodiment of the present invention has been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A Viterbi decoding method comprising the steps of:

receiving a signal representing a string of data at an nth time instant (where n is a positive integer), the string of data comprising a plurality of serial divisions each of which has a predetermined number of consecutive input data bits;

transforming the received signal into a plurality of division signals representing respective serial divisions of consecutive input data bits;

using a Trellis encoder for converting the division signal representing the input data bits of each division into a code signal representing consecutive Trellis code bits at the nth time instant;

generating a branch metric signal representing a minimum Euclidean distance between a reception signal point corresponding to the received signal including a noise component and each of a plurality of signal points in a signal space diagram, which correspond to the code signals representing Trellis codes, at the nth time instant correspondingly to each of first to eighth states represented by three bits obtained in the Trellis encoder and also generating a reception-signal-point signal representing the reception signal point;

generating a branch metric sum signal representing a sum of the minimum Euclidean distances corresponding to the first to eighth states, respectively, each of which is multiplied by a parameter, at the nth time instant and also generating a path metric signal representing a corresponding path metric at an $(n-1)$th time instant as a sum of the minimum Euclidean distances corresponding to a first time instant to the $(n-1)$th time instant, respectively;

generating a signal representing a sum of the minimum Euclidean distance at the nth time instant and the path metric at the $(n-1)$th time instant correspondingly to each of the first to eighth states as a path metric signal representing the path metric corresponding to each of the first to eighth states at the nth time instant;

determining the path metric signal representing a minimum one of the path metrics respectively corresponding to the first to eighth states at the nth time instant as an nth surviving path signal representing a part of a surviving path, which part corresponds to the nth time instant and similarly generating (n−1)th to first surviving path signals in that order;

generating a signal representing a signal point at the first time instant from the first surviving path signal; and restoring a signal representing input data bits received at the first time instant from the signal representing the signal point at the first time, wherein the step of generating the branch metric signal and the reception-signal-point signal further comprises the sub-steps of:

classifying the signals corresponding to the signal points according to the three bits into eight groups;

employing a signal of one of the eight groups as the signal of a reference group;

storing data used to obtain from the signal of the reference group the signals of groups other than the reference group; and generating seven tables representing the signal points of the other groups on the basis of a reference table which represents the signal points of the reference group.

2. The Viterbi decoding method according to claim 1, wherein, at the step of generating a branch metric sum signal at the nth time instant, the parameter is a gain $\alpha$ less than 1.

3. The Viterbi decoding method according to claim 1, wherein the step of generating a signal representing a signal point at the first time instant comprises the sub-steps of:

storing a cyclic table having rows representing the first to eighth states and columns representing the first to nth time instants;

writing a signal representing a jth signal point to a higher-order part of a cell of the table, corresponding to an ith state ($1 \leq 1 \leq 8$) and a jth time instant ($1 \leq j \leq n$); and writing signals representing coordinates of a signal point at a (j−1)th time instant, which is changed to the jth signal point at the jth time instant, to a lower-order part of the cell corresponding to an ith state and a jth time instant, wherein the column of the cyclic table corresponding to the first time instant is cyclically used in such a manner to correspond to an (n+1)th time instant.

4. The Viterbi decoding method according to claim 3, wherein the number n of the columns of the cyclic table representing the time instants is set as equal to 12.

5. The Viterbi decoding method according to claim 3, wherein the number n of the columns of the cyclic table representing the time instants is variable.

6. The Viterbi decoding method according to claim 1, wherein the step of generating the branch metric sum signal and also generating the path metric signal further comprises the sub-step of:

normalizing the path metrics corresponding to the first to eighth states to 0.

* * * * *